United States Patent
Lee et al.

(10) Patent No.: US 11,804,510 B2
(45) Date of Patent: Oct. 31, 2023

(54) IMAGE SENSOR INCLUDING ACTIVE REGIONS

(71) Applicant: SK hynix Inc., Icheon-si (KR)

(72) Inventors: Kyoung-In Lee, Icheon-si (KR);
Sung-Kun Park, Sejong-si (KR);
Sun-Ho Oh, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 702 days.

(21) Appl. No.: 16/522,533

(22) Filed: Jul. 25, 2019

(65) Prior Publication Data

US 2020/0119082 A1 Apr. 16, 2020

(30) Foreign Application Priority Data

Oct. 11, 2018 (KR) .................. 10-2018-0121229

(51) Int. Cl.
*H01L 27/148* (2006.01)
*H01L 27/146* (2006.01)

(52) U.S. Cl.
CPC .... *H01L 27/14831* (2013.01); *H01L 27/1463* (2013.01); *H01L 27/14612* (2013.01)

(58) Field of Classification Search
CPC ......... H01L 27/14831; H01L 27/14612; H01L 27/1463; H01L 27/14603; H01L 27/14616; H01L 27/14641; H01L 27/14614; H01L 27/14605
See application file for complete search history.

(56) References Cited

U.S. PATENT DOCUMENTS

| | | | |
|---|---|---|---|
| 8,614,759 B2 * | 12/2013 | Watanabe | H01L 27/14603 348/308 |
| 2008/0157150 A1 | 7/2008 | Shim | |
| 2009/0303371 A1 | 12/2009 | Watanabe et al. | |
| 2011/0108897 A1 | 5/2011 | Koo et al. | |
| 2016/0043132 A1 | 2/2016 | Ihara | |
| 2016/0086984 A1 * | 3/2016 | Wang | H01L 27/14689 257/292 |
| 2017/0040364 A1 | 2/2017 | Oh et al. | |
| 2018/0190699 A1 * | 7/2018 | Lee | H01L 27/14614 |

FOREIGN PATENT DOCUMENTS

| | | | |
|---|---|---|---|
| JP | 2008166780 A | | 7/2008 |
| JP | 2013162077 A | | 8/2013 |
| JP | 2019-145544 A | * | 8/2019 |
| KR | 100758321 B1 | | 9/2007 |
| KR | 20090127828 A | | 12/2009 |
| KR | 20110000853 A | | 1/2011 |
| KR | 20160034225 A | | 3/2016 |
| KR | 20170018206 A | | 2/2017 |
| KR | 20180080469 A | | 7/2018 |

* cited by examiner

*Primary Examiner* — Benjamin Tzu-Hung Liu
(74) *Attorney, Agent, or Firm* — Perkins Coie LLP

(57) ABSTRACT

An image sensor is provided to include an active region which comprises: a floating diffusion region; a transfer transistor gate region; transistor active regions; and a well-tap region. The transfer transistor gate region may have a diagonal bar shape to isolate the floating diffusion region in a first corner of the active region. The well-tap region may be positioned between the transfer transistor gate region and the transistor active regions, and isolate the transfer transistor gate region from the transistor active regions.

15 Claims, 24 Drawing Sheets

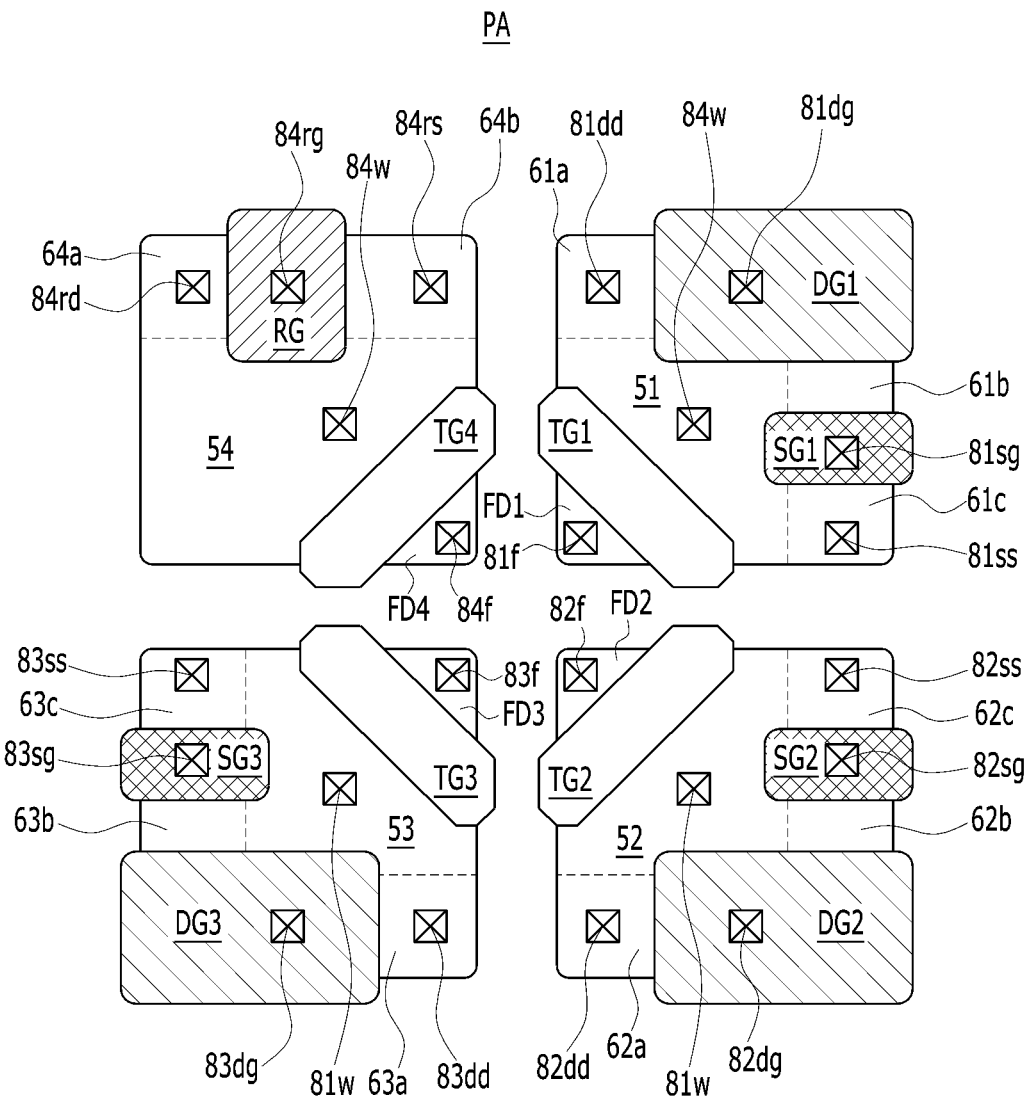

IMAGE SENSOR INCLUDING ACTIVE REGIONS

CROSS-REFERENCE TO RELATED APPLICATION

This patent document claims priority under 35 U.S.C. § 119 to Korean Patent Application No. 10-2018-0121229 filed on Oct. 11, 2018, which is incorporated herein by reference in its entirety.

TECHNICAL FIELD

The technology and implementations disclosed in this patent document relate to an image sensor including active regions.

BACKGROUND

With the recent development of information communication industry and the digitalization of electronic devices, enhanced image sensors are used in various fields such as a digital camera, camcorder, personal communication system (PCS), game machine, security camera, and medical microcamera.

SUMMARY

Various embodiments of the disclosed technology provide an image sensor capable of reducing a dark current. In some embodiments of the disclosed technology, an image sensor is provided to include active regions having N-type regions which are electrically and geometrically isolated through a structure in which a P-type well-tap region is disposed at the center without using a trench isolation region.

In one aspect, an image sensor is provided to include an active region, wherein the active region include: a floating diffusion region positioned around a first corner of the active region and operable to store photocharges generated in response to an incident light to the image censor; a transfer transistor gate region positioned adjacent to the floating diffusion region and operable to transfer the photocharges to the floating diffusion region; transistor active regions positioned adjacent to the transfer transistor gate region; and a well-tap region positioned between the transfer transistor gate region and the transistor active regions to separate the transfer transistor gate region from the transistor active regions.

In some implementations, the well-tap region may be positioned at the center of the active region. In some implementations, the transfer transistor gate region has a bar shape across the active region. In some implementations, the transfer transistor gate region has a bar shape extending along a diagonal direction between the floating diffusion region and the well-tap region. In some implementations, the well-tap region is extended to contact two neighboring sides of the active region. In some implementations, the transfer transistor gate region contacts two neighboring sides of the active region. In some implementations, the transistor active regions comprise a drive transistor drain region disposed adjacent to a second corner of the active region, a drive transistor channel region disposed adjacent to a third corner of the active region, and a select transistor source region disposed adjacent to a fourth corner of the active region. In some implementations, the transistor active region comprises a drive transistor drain region and a select transistor source region that include an N-doped region, and the transistor active region further comprises a drive transistor channel region including a P-doped region. In some implementations, the transistor active regions comprise a drive transistor channel region and a select transistor source region and further comprise a shared transistor region and a select transistor channel region that are disposed between the drive transistor channel region and the select transistor source region. In some implementations, the shared transistor region includes an N-doped region, and the select transistor channel region includes a P-doped region. In some implementations, the transistor active regions comprise a reset transistor drain region disposed adjacent to a second corner of the active region, a reset transistor source region disposed adjacent to a third corner of the active region, and a reset transistor channel region disposed between the reset transistor drain region and the reset transistor source region. In some implementations, the reset transistor channel region is disposed adjacent to a fourth corner of the active region, and abuts two neighboring sides of the active region, and wherein the second and third corners are opposite to each other. In some implementations, wherein the active region has a rectangular shape.

In another aspect, an image sensor comprising an active region is provided such that the active region comprises a well-tap region disposed around a center of the active region; a floating diffusion region disposed at a first side of the well-tap region; transistor active regions disposed at a second, opposite side of the well-tap region to the first side and including a transistor drain region, a transistor source region, and a transistor channel region disposed between the transistor source region and the transistor drain region; and a transfer transistor gate region disposed between the floating diffusion region and the well-tap region.

In some implementations, the well-tap region may abut two neighboring sides of the active region. In some implementations, the transfer transistor gate region may contact two neighboring sides of the active region, the floating diffusion region being located in a corner of the active region. In some implementations, the well-tap region abuts one side of the transfer transistor gate region, and abuts the transistor drain region and the transistor source region. In some implementations, the floating diffusion region, the transistor drain region and the transistor source region include N-doped regions, and the transistor channel region and the well-tap region include P-doped regions. In some implementations, the active region has a rectangular shape. In some implementations, the transfer transistor gate region extends across the active region and having a bar shape.

In another aspect, an image sensor may include first to fourth active regions defined by a trench isolation region and arranged in a matrix shape. The first to fourth active regions respectively may include: first to fourth floating diffusion regions; first to fourth well-tap regions; and first to fourth transistor active regions, wherein the first to fourth floating diffusion regions are disposed adjacent to first corners of the first to fourth active regions, respectively, the first to fourth well-tap regions may be disposed at the centers of the first to fourth active regions, respectively, the first to fourth transistor active regions may be disposed adjacent to second to fourth corners of the first to fourth active regions, respectively, and the first to fourth well-tap regions abut two neighboring sides of the first to fourth active regions to isolate the first to fourth floating diffusion regions from the first to fourth transistor active regions, respectively.

In some implementations, the first to fourth active regions further comprise first to fourth transfer transistor gate regions, respectively, each of the first to fourth transfer transistor gate being disposed between a corresponding one of the first to fourth floating diffusion regions and a corresponding one of the first to fourth well-tap regions.

In some implementations, the first to fourth transistor gate regions may abut the two neighboring sides of the first to fourth active regions, respectively.

In some implementations, the first to fourth well-tap regions may be P-doped regions, and the first to fourth transistor active regions may be N-doped regions.

In accordance with the various embodiments, the image sensor may include the P-type well-tap region for electrically and geometrically isolating the active region. Thus, the active region may be electrically and geometrically isolated by the P-doped region, not the trench isolation region.

In the image sensor, the trench isolation regions for electrically and spatially isolating the active regions may be reduced and replaced with the P-type isolation structure. Thus, a dark current generated at the interface may be reduced. Since the trench isolation region has been reduced, the degree of integration of the image sensor can be improved. Other effects in accordance with the present embodiments will be mentioned in this specification.

BRIEF DESCRIPTION OF THE DRAWINGS

FIG. 11B is an enlarged view of the arrangement of unit pixel blocks as shown in FIG. 11A.

DETAILED DESCRIPTION

Figure 1:
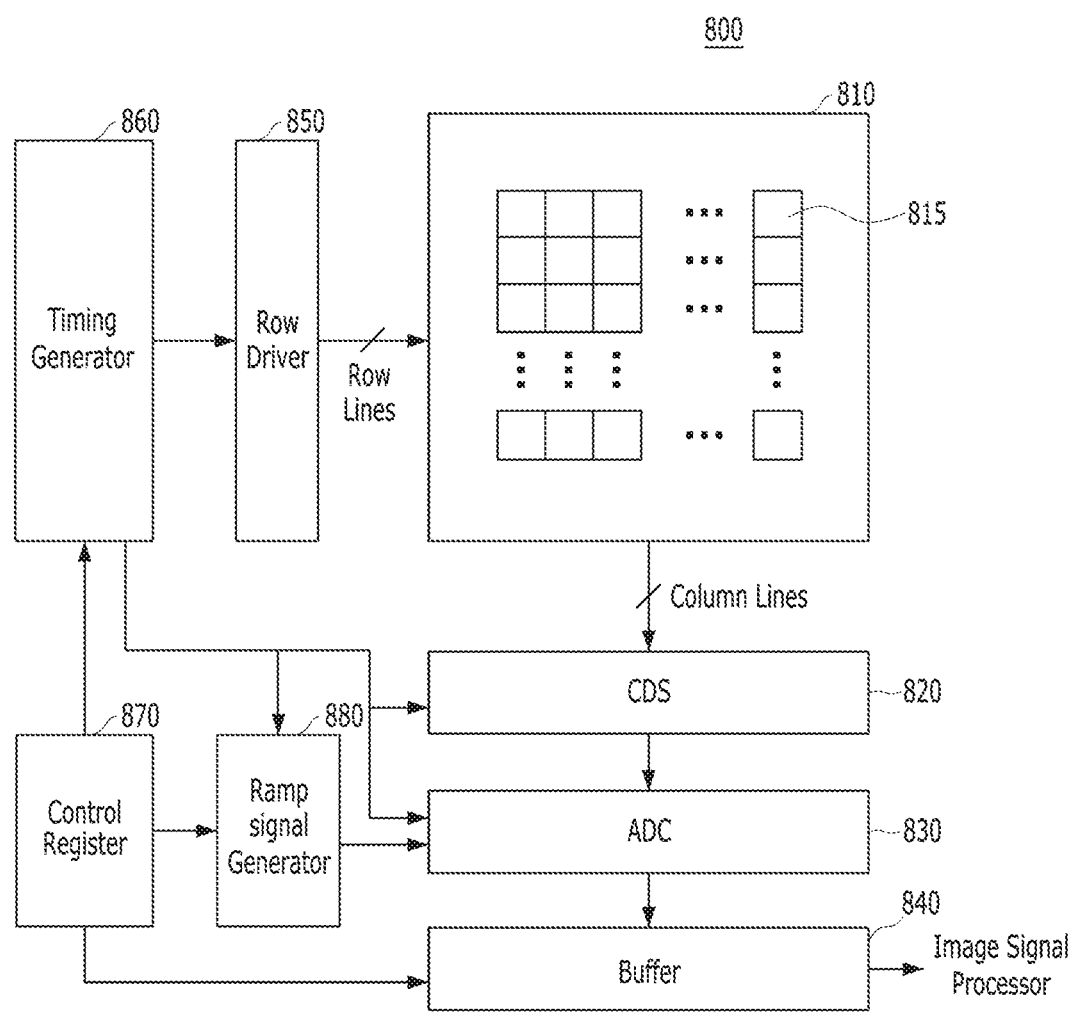
FIG. 1 is an example of a block diagram schematically illustrating an image sensor based on one implementation of the disclosed technology.

The advantages and characteristics of the present disclosure and a method for achieving the advantages and characteristics will be described through the following embodiments with reference to the accompanying drawings.

Throughout the specification, like reference numerals refer to like elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

An image sensor includes a pixel array for capturing and sensing incident light and a peripheral circuit area. The pixel array can include photosensing pixels arranged in an array which can be further arranged in unit pixel blocks including photosensing circuits such as photodiodes and pixel transistors. For electrical insulation between the photosensing circuits such as photodiodes and the pixel transistors, trench isolation regions such as shallow trench isolation (STI) are formed to include an electrical insulation material such as a dielectric material in a trench to provide electrical isolation between different IC circuits or components to reduce an undesired electrical leakage such as a dark current in a photosensing device that is produced in absence of incident light. Certain STI constructions may contribute the presence of the undesired dark current in a photoelectric conversion element in absence of incident light, including some STI structures having a dangling bond at the interface with silicon, thus leading to a small amount of the dark current.

The disclosed technology can be implemented to provide an image sensor exhibiting improved characteristics by using well-tap regions. In some implementations, the disclosed image sensor can prevent or reduce undesired characteristics such as a portion of the dark current caused by or contributed by the STI. Various implementations of the disclosed technology provide an image sensor including active regions.

FIG. 1 is an example of a block diagram schematically illustrating an image sensor 800 based on one implementation of the disclosed technology. Referring to FIG. 1, the image sensor 800 may include a pixel array 810, a correlated double sampler (CDS) 820, an analog-digital converter (ADC) 830, a buffer 840, a row driver 850, a timing generator 860, a control register 870 and a ramp signal generator 880.

The pixel array 810 may include a plurality of pixel blocks 815 arranged in a matrix structure. Each of the pixel blocks 815 may include a block of light sensing pixels (e.g., photodiodes) with each pixel being operable to sense light so that each pixel block 815 can convert optical image information into an electrical image signal, and transfer the electrical image signal to the CDS 820 through column lines. Each of the pixel blocks 815 may be coupled to one of row lines and one of the column lines. Under this design the pixel blocks 815 respond to incident light containing an optical image to produce electrical image signals representing the optical image.

The CDS 820 may temporarily store and sample the electrical image signals received from the pixel blocks 815 of the pixel array 810. For example, the CDS 820 may sample a reference voltage level and voltage levels of the received electrical image signals according to a clock signal provided from the timing generator 860, and transfer analog signals corresponding to differences therebetween to the ADC 830.

The ADC 830 may convert the received analog signals for the electrical image signals into digital signals representing the optical image, and transfer the digital signals to the buffer 840.

The buffer 840 may latch or hold the received digital signals representing the optical image, and sequentially output the latched or held signals to an external image signal processor. The buffer 840 may include a memory for latching the digital signals and a sense amplifier for amplifying the digital signals.

The row driver 850 may drive the plurality of pixel blocks 815 of the pixel array 810 according to a signal of the timing generator 860. For example, the row driver 850 may generate select signals for selecting one row line among the plurality of row lines and/or driving signals for driving the selected row line.

The timing generator 860 may generate a timing signal for controlling the CDS 820, the ADC 830, the row driver 850, and the ramp signal generator 880.

The control register 870 may generate control signals for controlling the buffer 840, the timing generator 860, and the ramp signal generator 880.

The ramp signal generator 880 may generate a ramp signal for controlling the image signal outputted from the buffer 840, under control of the timing generator 860.

Figure 2:
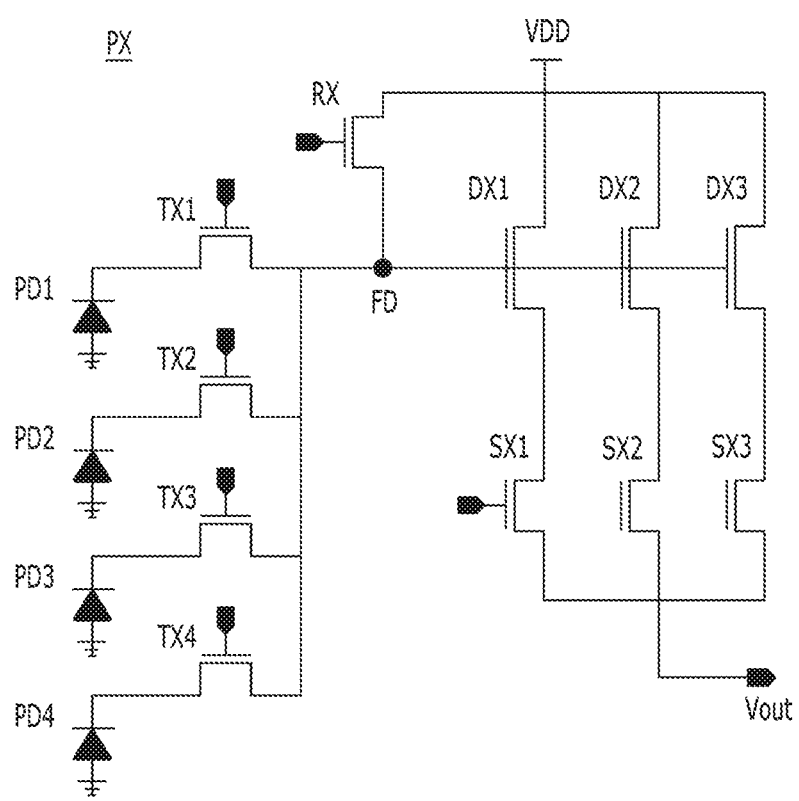
FIG. 2 is an equivalent circuit diagram of a unit pixel block of an image sensor based on one implementation of the disclosed technology.

FIG. 2 is an equivalent circuit diagram of a unit pixel block PX of an image sensor based on one implementation of the disclosed technology. Referring to FIG. 2, the unit pixel block PX may include first to fourth photodiodes PD1 to PD4, first to fourth transfer transistors TX1 to TX4, a floating diffusion region FD, a reset transistor RX, first to third drive transistors DX1 to DX3, and first to third select transistors SX1 to SX3. Although the unit pixel block PX in this specific example includes four photodiodes PD1 to PD4, one or photoelectric conversion elements may be used instead of four photodiodes and other types of optical detectors or photoelectric conversion elements may be used. For example, the photo electric conversion elements may be implanted by a photo sensing device or circuit including a photo diode, a photo transistor, a photo gate, or other photosensitive circuitry capable of converting light into a pixel signal (e.g., a charge, a voltage or a current). In this patent document, the photodiodes PD1 to PD4 are described as one example of the photoelectric conversion elements.

Each of the first to fourth photodiodes PD1 to PD4 may receive light and generate photocharges such as electron-hole pairs (EHPs). As described above, the first to fourth photodiodes PD1 to PD4 may include various photoelectric conversion devices such as a photo-gate, photo-transistor or charge-coupled device (CCD).

The first to fourth transfer transistors TX1 to TX4 may be electrically coupled to the first to fourth photodiodes PD1 to PD4, respectively. The first to fourth transfer transistors TX1 to TX4 may transfer photo-electrons to the floating diffusion region FD, the photo-electrons being generated in the first to fourth photodiodes PD1 to PD4.

The floating diffusion region FD, which receives the generated photo-electrons from the first to fourth transfer transistors TX1 to TX4, may provide the photo-electrons received from the first to fourth photodiodes PD1 to PD4 to the gate electrodes of the first to third drive transistors DX1 to DX3.

The gate electrodes of the first to third drive transistors DX1 to DX3 may be electrically coupled to the floating diffusion region FD. In some implementations, the first to third drive transistors DX1 to DX3 may be coupled in parallel to each other, and enabled at the same time.

The floating diffusion region FD and the source electrode of the reset transistor RX may be electrically coupled to each other. The drain electrode of the reset transistor RX may be electrically coupled to a supply voltage Vdd.

The drain electrodes of the first to third drive transistors DX1 to DX3 may also be electrically coupled to the supply voltage Vdd in common.

The source electrodes of the first to third drive transistors DX1 to DX3 may be electrically coupled to the drain electrodes of the first to third select transistors SX1 to SX3, respectively.

The gate electrodes of the first to third select transistors SX1 to SX3 may electrically couple to each other or to a common conductive node, pad, or element. The source electrodes of the first to third select transistors SX1 to SX3 may electrically couple to an output node Vout. In some implementations, the first to third select transistors SX1 to SX3 may be coupled in parallel to each other, and enabled at the same time.

Figure 3A:
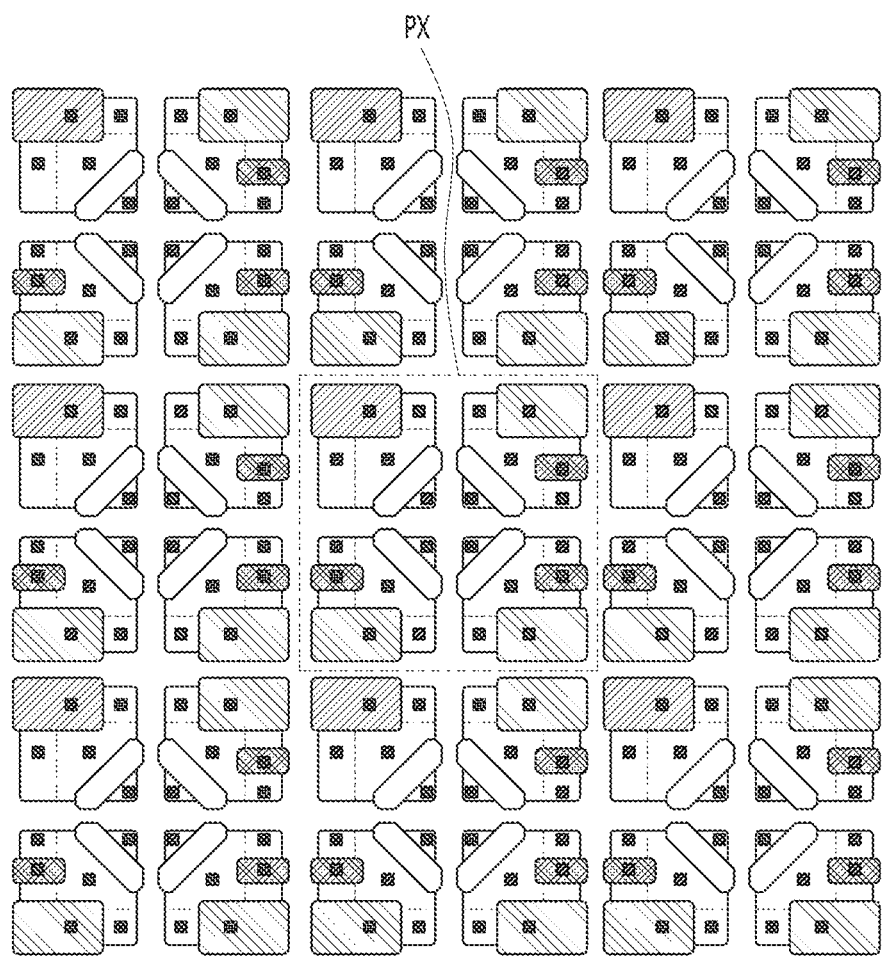
FIG. 3A is an example of a schematic layout of a pixel array of an image sensor based on one implementation of the disclosed technology.
Figure 3B:
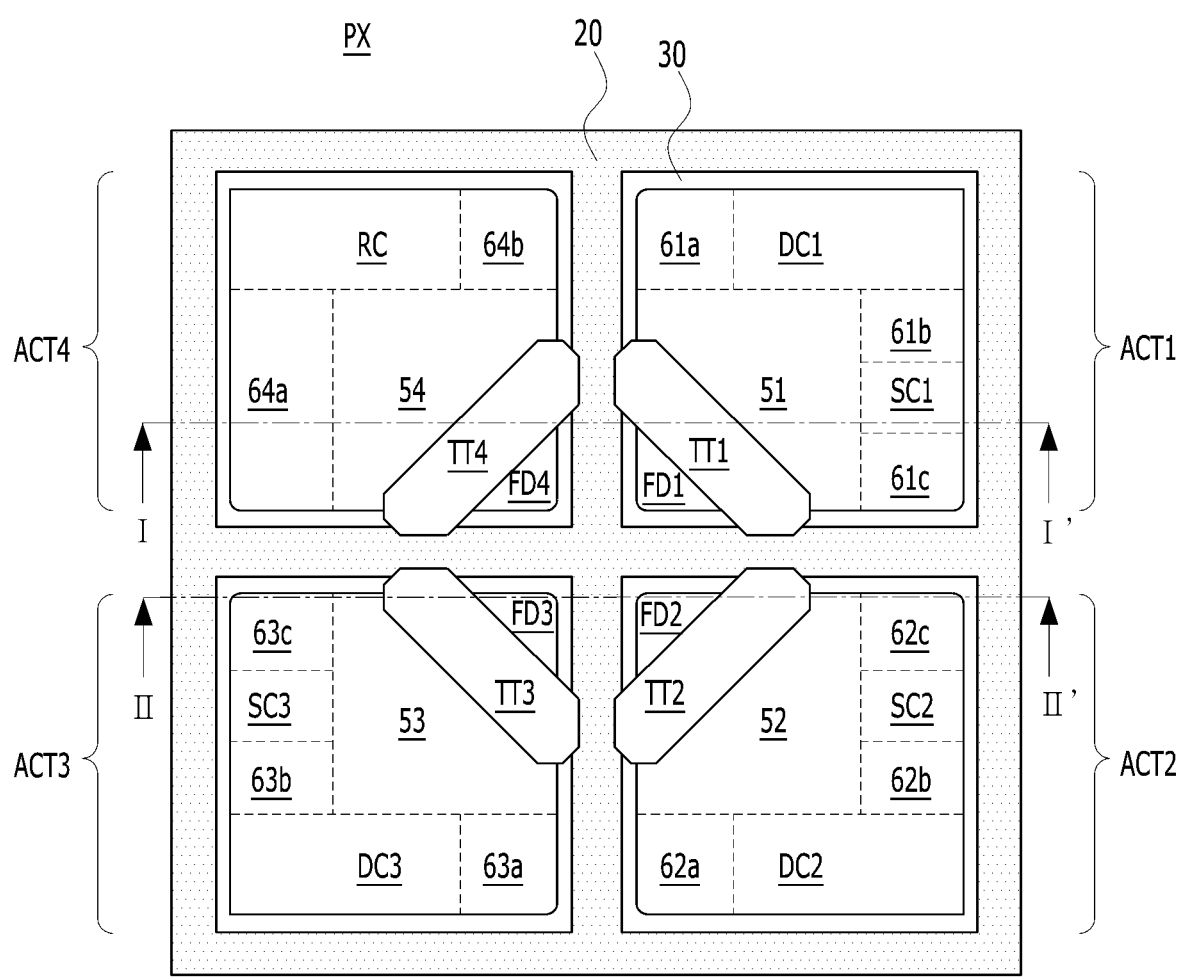
FIGS. 3B and 3C are enlarged views of a unit pixel block of FIG. 3A.
Figure 3C:
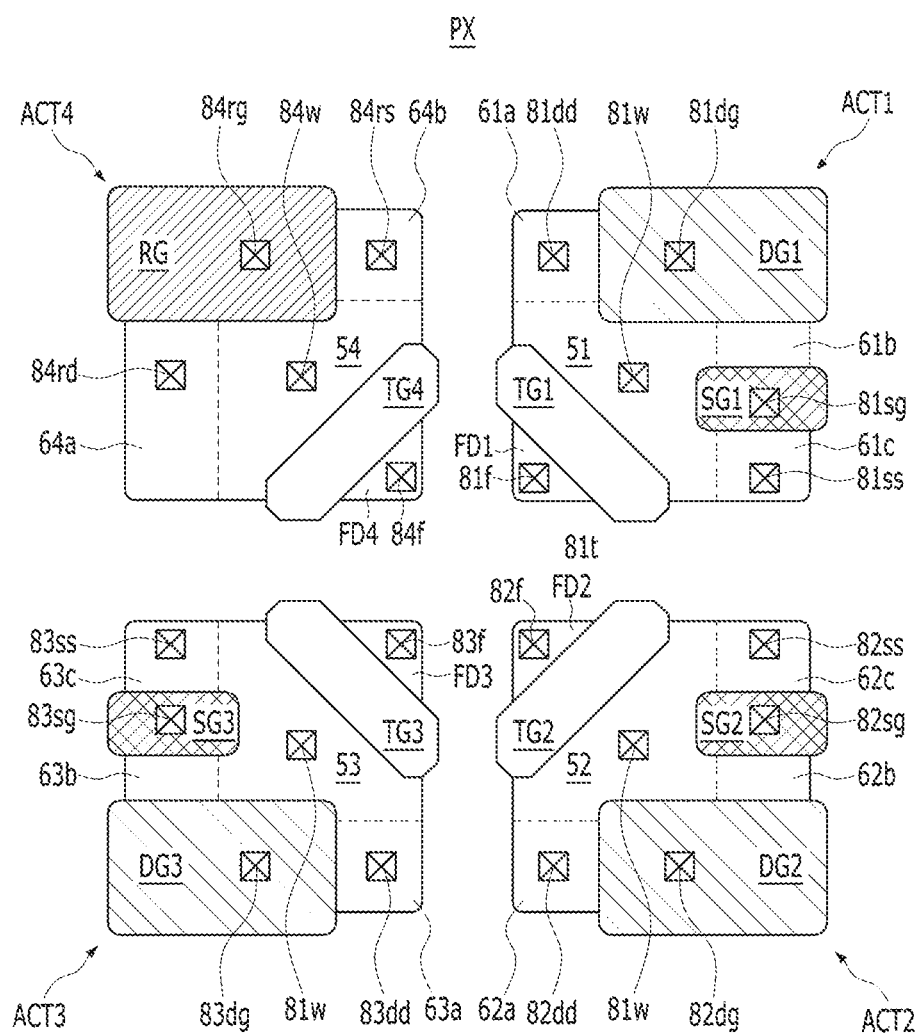

FIG. 3A is a schematic layout of a pixel array of an image sensor based on one implementation of the disclosed technology, and FIGS. 3B and 3C are enlarged views of a unit pixel block PX of FIG. 3A. FIG. 3B illustrates that first to fourth active regions ACT1 to ACT4 are defined by a deep trench isolation (DTI) region 20 and a shallow trench isolation (STI) region 30, and FIG. 3C illustrates that transistor gates DG1 to DG3, SG1 to SG3 and RG and contact regions 81*f* to 84*f*, 81*dg* to 83*dg*, 81*dd* to 83*dd*, 81*sg* to 83*sg*, 81*ss* to 83*ss*, 84*rg*, 84*rd*, and 84*rs* are arranged.

Referring to FIGS. 3A to 3C, the pixel array 810 of the image sensor 800 may include the plurality of active regions ACT1 to ACT4 which are defined by the DTI region 20 and the STI region 30, and arranged in a matrix form. The number of the active regions included in the pixel array 810 can be changed depending on the design requirements and others.

Referring to FIG. 3B, the first active region ACT1 may include a first transfer transistor gate region TT1, a first floating diffusion region FD1, a first well-tap region 51, and first transistor active regions DC1, SC1, 61*a*, 61*b*, and 61*c*.

The first transfer transistor gate region TT1 may have a bar shape disposed between the first floating diffusion region FD1 and the first well-tap region 51. The first transfer transistor gate region TT1 may cross the first active region ACT1 in the diagonal direction and both ends of the first transfer transistor gate region TT1 may contact two neighboring sides of the first active region ACT1. The first transfer transistor gate region TT1 may include a trench or recess in which a gate electrode of a first transfer transistor is to be formed. The first transfer transistor gate region TT1 may geometrically separate the first floating diffusion region FD1 from the first well-tap region 51 such that the first floating diffusion region FD1 located in one corner of the first active region ACT1 can be isolated from the first transistor active regions DC1, SC1, 61*a*, 61*b*, and 61*c*. The first transfer transistor gate region TT1 may have two opposite sides which contact the first floating diffusion region FD1 and the first well-tap region 51, respectively. The two sides of the first transfer transistor gate region TT1 may have a same length or different lengths from each other. In some implementations, when the two sides of the first transfer transistor gate region TT1 have different lengths from each other, a relatively short side of the first transfer transistor gate region TT1 may abut the first floating diffusion region FD1, and a relatively long side of the first transfer transistor gate region TT1 may abut the first well-tap region 51.

The first well-tap region 51 may be formed at or around the center of the first active region ACT1. The first well-tap region 51 may abut the two neighboring sides of the first active region ACT1, which contact the both ends of the first transfer transistor gate region TT1. The first well-tap region 51 may be or include a P-doped region doped with P-type ions such as boron (B). The first well-tap region 51 may abut the first transistor active regions DC1, SC1, 61a, 61b, and 61c.

The first transistor active regions DC1, SC1, 61a, 61b, and 61c may include a first drive transistor channel region DC1, a first select transistor channel region SC1, a first drive transistor drain region 61a, a first shared transistor source/drain region 61b and a first select transistor source region 61c. The first drive transistor channel region DC1 and the first select transistor channel region SC1 may be or include P-doped regions doped with P-type ions such as B. The first drive transistor drain region 61a, the first shared transistor source/drain region 61b, and the first select transistor source region 61c may be or include N-doped regions doped with N-type ions such as phosphorous (P) or arsenic (As). The first drive transistor channel region DC1, the first select transistor channel region SC1, and the first well-tap region 51 may be electrically and geometrically coupled to each other. Therefore, the first drive transistor drain region 61a, the first shared transistor source/drain region 61b, and the first select transistor source region 61c may be electrically and geometrically isolated from one another by the first drive transistor channel region DC1, the first select transistor channel region SC1, and the first well-tap region 51.

The first active region ACT1 may have a rectangular shape defined by the DTI region 20 and the STI region 30. In some implementations, the DTI region 20 and the STI region 30 may have a grid shape. When the first active region ACT1 has a rectangular shape, the first drive transistor channel region DC1 may be disposed on a first corner of the first active region ACT1, the first select transistor source region 61c may be disposed on a second corner of the first active region ACT1, the first floating diffusion region FD1 may be disposed on a third corner of the first active region ACT1, and the first drive transistor drain region 61a may be disposed on a fourth corner of the first active region ACT1.

The second active region ACT2 may include a second transfer transistor gate region TT2, a second floating diffusion region FD2, a second well-tap region 52, and second transistor active regions DC2, SC2, 62a, 62b, and 62c. The second active region ACT2 may have a layout obtained by mirroring the first active region ACT1 in the column direction.

The second transfer transistor gate region TT2 may have a bar shape disposed between the second floating diffusion region FD2 and the second well-tap region 52. The second transfer transistor gate region TT2 may cross the second active region ACT2 in the diagonal direction and both ends of the second transfer transistor gate region TT2 may contact two sides of the second active region ACT2. The second transfer transistor gate region TT2 may include a trench or recess in which a gate electrode of a second transfer transistor is to be formed. The second transfer transistor gate region TT2 may geometrically separate the second floating diffusion region FD2 from the second well-tap region 52 such that the second floating diffusion region FD2 located in one corner of the second active region ACT2 can be isolated from the second transistor active regions DC2, SC2, 62a, 62b, and 62c. The second transfer transistor gate region TT2 may have two opposite sides which contact the second floating diffusion region FD2 and the second well-tap region 52, respectively. The two sides of the second transfer transistor gate region TT2 may have a same length or different lengths from each other. In some implementations, when the two sides of the second transfer transistor gate region TT2 have different lengths from each other, a relatively short side of the second transfer transistor gate region TT2 may abut the second floating diffusion region FD2, and a relatively long side of the second transfer transistor gate region TT2 may abut the second well-tap region 52.

The second well-tap region 52 may be formed at or around the center of the second active region ACT2. The second well-tap region 52 may abut two neighboring sides of the second active region ACT2, which cross both ends of the second transfer transistor gate region TT2. The second well-tap region 52 may be or include a P-doped region doped with P-type ions such as B. The second well-tap region 52 may abut the second transistor active regions DC2, SC2, 62a, 62b, and 62c.

The second transistor active regions DC2, SC2, 62a, 62b, and 62c may include a second drive transistor channel region DC2, a second select transistor channel region SC2, a second drive transistor drain region 62a, a second shared transistor source/drain region 62b, and a second select transistor source region 62c. The second drive transistor channel region DC2 and the second select transistor channel region SC2 may be or include P-doped regions doped with P-type ions such as B. The second drive transistor drain region 62a, the second shared transistor source/drain region 62b, and the second select transistor source region 62c may be or include N-doped regions doped with N-type ions such as P or As. The second drive transistor channel region DC2, the second select transistor channel region SC2, and the second well-tap region 52 may be electrically and geometrically coupled to each other. Therefore, the second drive transistor drain region 62a, the second shared transistor source/drain region 62b, and the second select transistor source region 62c may be electrically and geometrically isolated from one another by the second drive transistor channel region DC2, the second select transistor channel region SC2, and the second well-tap region 52.

The second active region ACT2 may have a rectangular shape defined by the DTI region 20 and the STI region 30. In some implementations, the DTI region 20 and the STI region 30 may have a grid shape. When the second active region ACT2 has a rectangular shape, the second select transistor source region 62c may be disposed on a first corner of the second active region ACT2, the second drive transistor channel region DC2 may be disposed on a second corner of the second active region ACT2, the second drive transistor drain region 62a may be disposed on a third corner of the second active region ACT2, and the second floating diffusion region FD2 may be disposed on a fourth corner of the second active region ACT2.

The third active region ACT3 may include a third transfer transistor gate region TT3, a third floating diffusion region FD3, a third well-tap region 53, and third transistor active regions DC3, SC3, 63a, 63b, and 63c. The third active region ACT3 may have a layout obtained by mirroring the second active region ACT2 in the row direction.

The third transfer transistor gate region TT3 may have a bar shape disposed between the third floating diffusion region FD3 and the third well-tap region 53. The third transfer transistor gate region TT3 may cross the third active region ACT3 in the diagonal direction and both ends of the third transfer transistor gate region TT3 may contact two sides of the third active region ACT3. The third transfer transistor gate region TT3 may include a trench or recess in which a gate electrode of a third transfer transistor is to be formed. The third transfer transistor gate region TT3 may geometrically separate the third floating diffusion region FD3 from the third well-tap region 53 such that the third floating diffusion region FD3 located in one corner of the third active region ACT3 can be isolated from the third transistor active regions DC3, SC3, 63a, 63b, and 63c. The third transfer transistor gate region TT3 may have two opposite sides which contact the third floating diffusion region FD3 and the third well-tap region 53, respectively. The two sides of the third transfer transistor gate region TT3 may have a same length or different lengths from each other. In some implementations, when the two sides of the third transfer transistor gate region TT3 have different lengths from each other, a relatively short side of the third transfer transistor gate region TT3 may abut the third floating diffusion region FD3, and a relatively long side of the third transfer transistor gate region TT3 may abut the third well-tap region 53.

The third well-tap region 53 may be formed at or around the center of the third active region ACT3. The third well-tap region 53 may abut two neighboring sides of the third active region ACT3, which contact the both ends of the third transfer transistor gate region TT3. The third well-tap region 53 may be or include a P-doped region doped with P-type ions such as B. The third well-tap region 53 may abut the third transistor active regions DC3, SC3, 63a, 63b, and 63c.

The third transistor active regions DC3, SC3, 63a, 63b, and 63c may include a third drive transistor channel region DC3, a third select transistor channel region SC3, a third drive transistor drain region 63a, a third shared transistor source/drain region 63b, and a third select transistor source region 63c. The third drive transistor channel region DC3 and the third select transistor channel region SC3 may be or include P-doped regions doped with P-type ions such as B. The third drive transistor drain region 63a, the third shared transistor source/drain region 63b, and the third select transistor source region 63c may be or include N-doped regions doped with N-type ions such as P or As. The third drive transistor channel region DC3, the third select transistor channel region SC3, and the third well-tap region 53 may be electrically and geometrically coupled to each other. Therefore, the third drive transistor drain region 63a, the third shared transistor source/drain region 63b, and the third select transistor source region 63c may be electrically and geometrically isolated from one another by the third drive transistor channel region DC3, the third select transistor channel region SC3, and the third well-tap region 53.

The third active region ACT3 may have a rectangular shape defined by the DTI region 20 and the STI region 30. In some implementations, the DTI region 20 and the STI region 30 may have a grid shape. When the third active region ACT3 has a rectangular shape, the third floating diffusion region FD3 may be disposed on a first corner of the third active region ACT3, the third drive transistor drain region 63a may be disposed on a second corner of the third active region ACT3, the third drive transistor channel region DC3 may be disposed on a third corner of the third active region ACT3, and the third select transistor source region 63c may be disposed on a fourth corner of the third active region ACT3.

The fourth active region ACT4 may include a fourth transfer transistor gate region TT4, a fourth floating diffusion region FD4, a fourth well-tap region 54, and fourth transistor active regions RC, 64a, and 64b.

The fourth transfer transistor gate region TT4 may have a bar shape disposed between the fourth floating diffusion region FD4 and the fourth well-tap region 54. The fourth transfer transistor gate region TT4 may cross the fourth active region ACT4 in the diagonal direction and both ends of the fourth transfer transistor gate region TT4 may contact two sides of the fourth active region ACT4. The fourth transfer transistor gate region TT4 may include a trench or recess in which a gate electrode of a fourth transfer transistor is to be formed. The fourth transfer transistor gate region TT4 may geometrically separate the fourth floating diffusion region FD4 from the fourth well-tap region 54 such that the fourth floating diffusion region FD4 located in one corner of the fourth active region ACT4 can be isolated from the fourth transistor active regions DC4, SC4, 64a, 64b, and 64c. The fourth transfer transistor gate region TT4 may have two opposite sides which contact the fourth floating diffusion region FD4 and the fourth well-tap region 54, respectively. The two sides of the fourth transfer transistor gate region TT4 may have a same length or different lengths from each other. In some implementations, when the two sides of the fourth first transfer transistor gate region TT4 have different lengths from each other, a relatively short side of the fourth transfer transistor gate region TT4 may abut the fourth floating diffusion region FD4, and a relatively long side of the fourth transfer transistor gate region TT4 may abut the fourth well-tap region 54.

The fourth well-tap region 54 may be formed at or around the center of the fourth active region ACT4. The fourth well-tap region 54 may abut two neighboring sides of the fourth active region ACT4, which contact the both ends of the fourth transfer transistor gate region TT4. The fourth well-tap region 54 may be or include a P-doped region doped with P-type ions such as B. The fourth well-tap region 54 may abut the fourth transistor active regions RC, 64a, and 64b.

The fourth transistor active regions RC, 64a, and 64b may include a reset transistor channel region RC, a reset transistor drain region 64a, and a reset transistor source region 64b.

The reset transistor channel region RC may be or include a P-doped region doped with P-type ions such as B. The reset transistor drain region 64a and the reset transistor source region 64b may be or include N-doped regions doped with N-type ions such as P or As. The reset transistor channel region RC and the fourth well-tap region 54 may be electrically and geometrically coupled to each other. Therefore, the reset transistor drain region 64a and the reset transistor source region 64b may be electrically and geometrically isolated from each other by the reset transistor channel region RC and the fourth well-tap region 54.

The fourth active region ACT4 may have a rectangular shape defined by the DTI region 20 and the STI region 30. In some implementations, the DTI region 20 and the STI region 30 may have a grid shape. When the fourth active region ACT4 has a rectangular shape, the reset transistor source region 64b may be disposed on a first corner of the fourth active region ACT4, the fourth floating diffusion region FD4 may be disposed on a second corner of the fourth active region ACT4, the reset transistor drain region 64a may be disposed on a third corner of the fourth active region ACT4, and the reset transistor channel region RC may be disposed on a fourth corner of the fourth active region ACT4.

In FIG. 3B, the first corner may be set to the right top corner, the second corner may be set to the right bottom corner, the third corner may be set to the left bottom corner, and the fourth corner may be set to the left top corner. However, this is only an example for convenience of description, and the positions of the first to fourth corners may be changed depending on a viewing direction or an order of the descriptions. The first to fourth corners are used to indicate four different corners. Thus, although the respective corners may be named as the first to fourth corners in the clockwise direction in the drawings, it is also possible to name the first to fourth corners in a counterclockwise direction or a diagonal direction.

Referring to FIGS. 3B and 3C, in the first active region ACT1, a first drive transistor gate DG1 may be disposed on the first drive transistor channel region DC1, and a first select transistor gate SG1 may be disposed on the first select transistor channel region SC1. A first transfer transistor gate TG1 may be formed in the first transfer transistor gate region TT1. A first floating diffusion contact 81f may be disposed on the first floating diffusion region FD1, a first pick-up contact 81w may be disposed on the first well-tap region 51, a first drive transistor drain contact 81dd may be disposed on the first drive transistor drain region 61a, and a first select transistor source contact 81ss may be disposed on the first select transistor source region 61c. A first drive transistor gate contact 81dg may be disposed on the first drive transistor gate DG1, and a first select transistor gate contact 81sg may be disposed on the first select transistor gate SG1. The first well-tap region 51 may abut one side of the first transfer transistor gate TG1, two neighboring sides of the first active region ACT1 which contact the both ends of the first transfer transistor gate TG1, the first drive transistor gate DG1, the first select transistor gate SG1, the first drive transistor drain region 61a, the first shared transistor source/drain region 61b, and the first select transistor source region 61c.

In the second active region ACT2, a second drive transistor gate DG2 may be disposed on the second drive transistor channel region DC2, and a second select transistor gate SG2 may be disposed on the second select transistor channel region SC2. A second transfer transistor gate TG2 may be formed in the second transfer transistor gate region TT2. A second floating diffusion contact 82f may be disposed on the second floating diffusion region FD2, a second pick-up contact 82w may be disposed on the second well-tap region 52, a second drive transistor drain contact 82dd may be disposed on the second drive transistor drain region 62a, and a second select transistor source contact 82ss may be disposed on the second select transistor source region 62c. A second drive transistor gate contact 82dg may be disposed on the second drive transistor gate DG2, and a second select transistor gate contact 82sg may be disposed on the second select transistor gate SG2. The second well-tap region 52 may abut one side of the second transfer transistor gate TG2, two neighboring sides of the second active region ACT2 which contact the both ends of the second transfer transistor gate TG2, the second drive transistor gate DG2, the second select transistor gate SG2, the second drive transistor drain region 62a, the second shared transistor source/drain region 62b, and the second select transistor source region 62c.

In the third active region ACT3, a third drive transistor gate DG3 may be disposed on the third drive transistor channel region DC3, and a third select transistor gate SG3 may be disposed on the third select transistor channel region SC3. A third transfer transistor gate TG3 may be formed in the third transfer transistor gate region TT3. A third floating diffusion contact 83f may be disposed on the third floating diffusion region FD3, a third pick-up contact 83w may be disposed on the third well-tap region 53, a third drive transistor drain contact 83dd may be disposed on the third drive transistor drain region 63a, and a third select transistor source contact 83ss may be disposed on the third select transistor source region 63c. A third drive transistor gate contact 83dg may be disposed on the third drive transistor gate DG3, and a third select transistor gate contact 83sg may be disposed on the third select transistor gate SG3. The third well-tap region 53 may abut one side of the third transfer transistor gate TG3, two neighboring sides of the third active region ACT3 which contact the both ends of the third transfer transistor gate TG3, the third drive transistor gate DG3, the third select transistor gate SG3, the third drive transistor drain region 63a, the third shared transistor source/drain region 63b, and the third select transistor source region 63c.

In the fourth active region ACT4, a reset transistor gate RG may be disposed on the reset transistor channel region RC. A fourth transfer transistor gate TG4 may be formed in the fourth transfer transistor gate region TT4. A fourth floating diffusion contact 84f may be disposed on the fourth floating diffusion region FD4, a fourth pick-up contact 84w may be disposed on the fourth well-tap region 54, a reset transistor drain contact 84rd may be disposed on the reset transistor drain region 64a, and a reset transistor source contact 84rs may be disposed on the reset transistor source region 64b. A reset transistor gate contact 84rg may be disposed on the reset transistor gate RG. The fourth well-tap region 54 may abut one side of the fourth transfer transistor gate TG4, two neighboring sides of the fourth active region ACT4 which contact the both ends of the fourth transfer transistor gate TG4, the reset transistor gate RG, the reset transistor drain region 64a, and the reset transistor source region 64b.

The first to fourth transfer transistor gates TG1 to TG4 may transfer photocharges to the first to fourth floating diffusion regions FD1 to FD4, the photocharges being generated in photoelectric conversion units (not illustrated) such as photodiodes. The first to fourth floating diffusion regions FD1 to FD4 may temporarily store the photocharges. The photocharges which are temporarily stored in the first to fourth floating diffusion regions FD1 to FD4 may be transferred to the outside through the first to fourth floating diffusion contacts 81f to 84f. In some implementations, the photocharges which are temporarily stored in the first to fourth floating diffusion regions FD1 to FD4 may be reset to the initial state, for example, a supply voltage level Vdd through the first to fourth floating diffusion contacts 81f to 84f.

The first to fourth well-tap regions 51 to 54 may provide a ground voltage Vss into a substrate through the first to fourth pick-up contacts 81w to 84w.

The first to third drive transistor gates DG1 to DG3 may receive the photocharges from the first to fourth floating diffusion regions FD1 to FD4 through the first to third drive transistor gate contacts 81dg to 83dg and the first to fourth floating diffusion contacts 81f to 84f.

The first to third drive transistor drain regions 61a to 63a may receive the supply voltage Vdd through the first to third drive transistor drain contacts 81dd to 83dd, respectively. As the first to third drive transistor gates DG1 to DG3 are turned on, the supply voltages provided to the first to third drive transistor drain regions 61a to 63a may be transferred to the first to third shared transistor source/drain regions 61b to 63b, respectively. The supply voltages transferred from the first to third drive transistor drain regions 61a to 63a to the first to third shard transistor source/drain regions 61*b* to 63*b* form image signals. The image signals transferred to the first to third shared transistor source/drain regions 61*b* to 63*b* may be transferred to the first to third select transistor source regions 61*c* to 63*c*, respectively, as the first to third select transistor gates SG1 to SG3 are turned on. The image signals transferred to the first to third select transistor source regions 61*c* to 63*c* may be outputted to the outside through the first to third select transistor source contacts 81*ss* to 83*ss*.

The reset transistor drain region 64*a* may receive the supply voltage Vdd through the reset transistor drain contact 84*rd*. As the reset transistor gate RG is turned on, the supply voltage Vdd may be provided to the reset transistor source region 64*b*, and provided to the outside through the reset transistor source contact 84*rs*. For example, the supply voltage Vdd provided to the reset transistor source region 64*b* may be provided to the first to fourth floating diffusion regions FD1 to FD4 through the reset transistor source contact 84*rs* and the first to fourth floating diffusion contacts 81*f* to 84*f* Furthermore, the supply voltage Vdd provided to the reset transistor source region 64*b* may be provided to the first to third drive transistor drain regions 61*a* to 63*a* through the reset transistor source contact 84*rs*, and the first to third drive transistor drain contacts 81*dd* to 83*dd*.

Based on the descriptions of the implementations of the disclosed technology, in the first to fourth active regions ACT1 to ACT4, the first to fourth floating diffusion regions FD1 to FD4 may be electrically and geometrically isolated from the first to fourth transistor active regions DC1 to DC3, SC1 to SC3, RC, 61*a* to 63*a*, 61*b* to 63*b*, 61*c* to 63*c*, 64*a*, and 64*b* by the first to fourth transfer transistor gate regions TT1 to TT4 and the first to fourth well-tap regions 51 to 54, respectively. In accordance with some implementations of the disclosed technology, the various active regions including doped ions may be electrically and geometrically isolated by using the doping polarities of the various active regions without forming the trench isolation regions such as the deep trench isolation (DTI) regions and the shallow trench isolation (STI) regions. Since the trench isolation regions are not used to separate portions of the active regions of the image sensor, it is possible to minimize the occurrence of the undesired dark current which can be generated at the interfaces between any trench isolation regions and doped portions of the active regions.

As discussed above, in some implementations of the disclosed technology, some parts of the active regions having a first doping polarity can be electrically isolated by other parts of the active regions having a second, different doping polarity form the first doping polarity. In the implementations of the disclosed technology, the parts of the active regions having the first doping polarity may be also physically separately located from other parts of the active regions having the second doping polarity. For example, among the first to fourth transistor active regions DC1 to DC3, SC1 to SC3, RC, 61*a* to 63*a*, 61*b* to 63*b*, 61*c* to 63*c*, 64*a*, and 64*b*, the drain and source regions 61*a* to 63*a*, 61*b* to 63*b*, 61*c* to 63*c*, 64*a*, and 64*b* which are N-doped regions may be electrically and geometrically isolated from the first to fourth floating diffusion regions FD1 to FD4 by the first to fourth well-tap regions 51 to 54 and the transistor channel regions DC1 to DC3, SC1 to SC3, and RC, which are P-doped regions. For example, the trench isolation region such as the STI region 30 may not be formed between the first to fourth floating diffusion regions FD1 to FD4, and the drain and source regions 61*a* to 63*a*, 61*b* to 63*b*, 61*c* to 63*c*, 64*a*, and 64*b* which are N-doped regions, among the first to fourth transistor active regions DC1 to DC3, SC1 to SC3, RC, 61*a* to 63*a*, 61*b* to 63*b*, 61*c* to 63*c*, 64*a*, and 64*b*. The first to fourth well-tap regions 51 to 54 may have a higher P-type ion doping concentration than the substrate 10 and the transistor channel regions DC1 to DC3, SC1 to SC3, and RC.

Figure 4A:
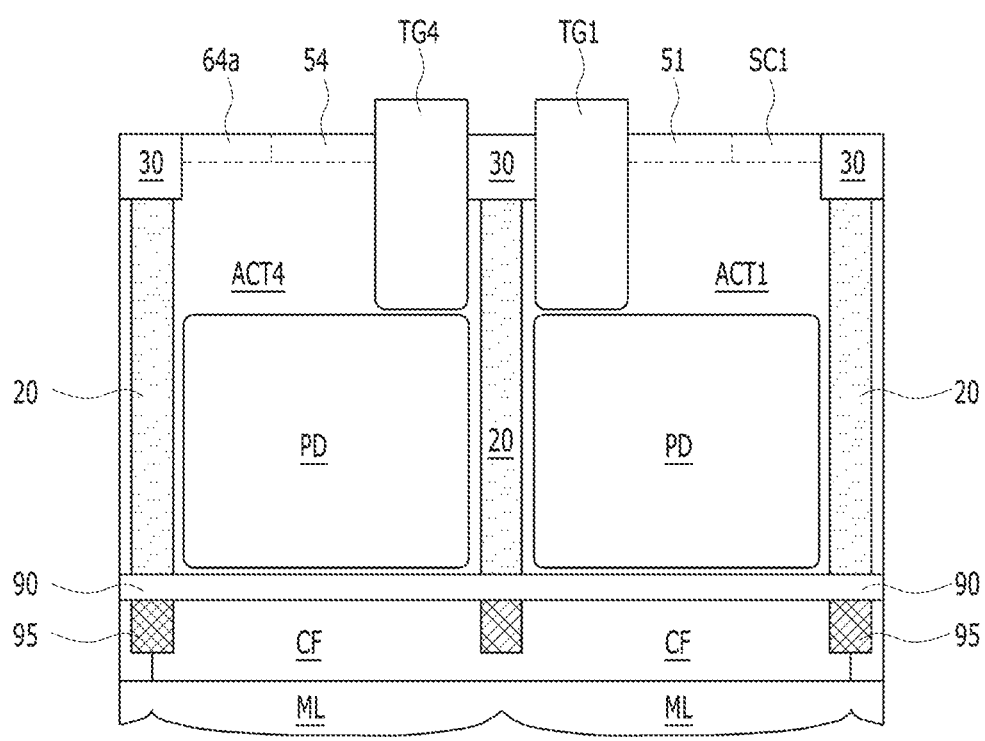
FIGS. 4A and 4B are longitudinal cross-sectional views of a unit pixel block of an image sensor taken along the lines I-I' and II-II' of FIG. 3B.
Figure 4B:
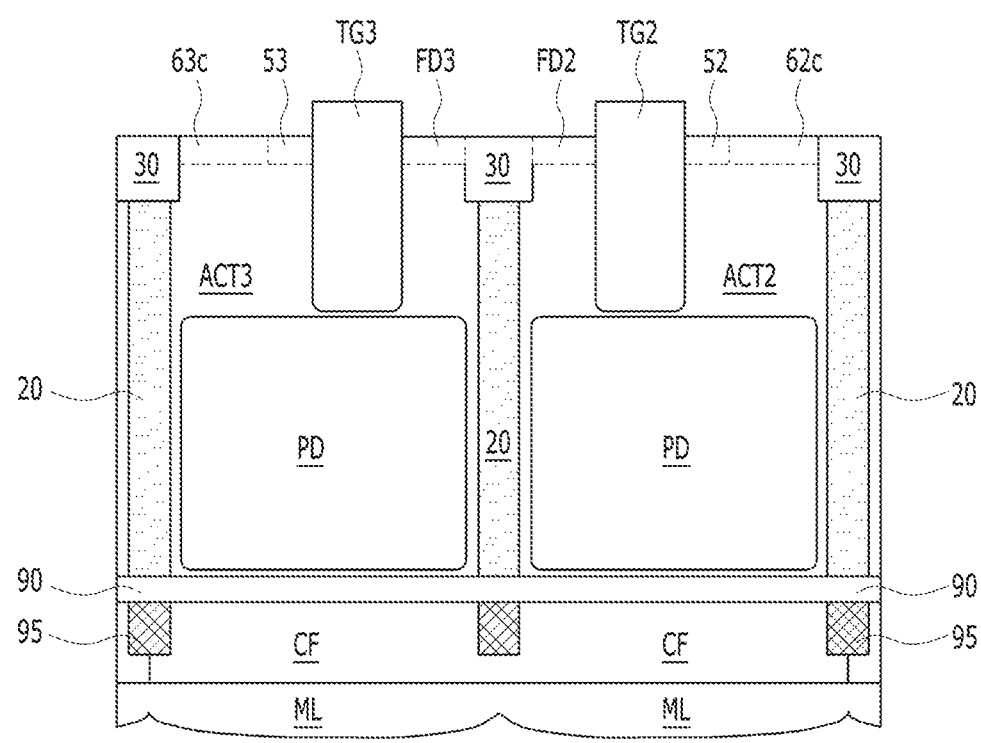

FIGS. 4A and 4B are longitudinal cross-sectional views of the unit pixel block PX of the image sensor 800, taken along the lines I-I' and II-II' of FIG. 3B. Referring to FIGS. 4A and 4B, the image sensor 800 may include photodiodes PD formed in the substrate 10, the DTI regions 20, the STI regions 30, the first to fourth transfer transistor gates TG1 to TG4 buried in the substrate 10, the first to fourth floating diffusion regions FD1 to FD4 formed in the substrate 10 so as to abut the top surface of the substrate 10, the first to fourth transistor active regions DC1 to DC3, SC1 to SC3, RC, 61*a* to 63*a*, 61*b* to 63*b*, 61*c* to 63*c*, 64*a*, and 64*b*, and the first to fourth well-tap regions 51 to 54. The image sensor 800 may further include an anti-reflection layer 90, grid patterns 95, color filters CF, and microlenses ML, which are formed on the bottom surface of the substrate 10.

The DTI regions 20 may be aligned to vertically overlap the respective STI regions 30. The DTI regions 20 and the STI regions 30 may electrically and spatially isolate the first to fourth active regions ACT1 to ACT4. The DTI region 20 may be disposed between the photodiodes PD. The photodiodes PD may receive light having passed through the microlenses ML, the color filters CF, and the anti-reflection layer 90, which are disposed on the bottom surface of the substrate 10, and generate photocharges. The photocharges generated in the photodiodes PD may be transferred to the first to fourth floating diffusion regions FD1 to FD4, as the first to fourth transfer transistor gates TG1 to TG4 are turned on.

The anti-reflection layer 90 may include a plurality of stacked dielectric layers. For example, the anti-reflection layer 90 may include two or more layers of silicon oxide ($SiO_2$), silicon nitride (SiN), aluminum oxide (AlO), hafnium oxide (HfO), tantalum oxide (TaO), or other dielectric materials. The grid patterns 95 may include an opaque metallic material such as tungsten (W), for example. The color filters CF may screen light having passed through the microlenses ML, and provide light having one wavelength of green (G), red (R), and blue (B) to the photodiodes PD. Therefore, the photodiodes PD may generate photocharges corresponding to the intensity of the received green, red or blue light. The microlenses ML may have a convex lens shape, and focus light on the photodiodes PD. The anti-reflection layer 90 may include an inorganic material, and the color filters CF and the microlenses ML may include an organic material.

Figure 5A:
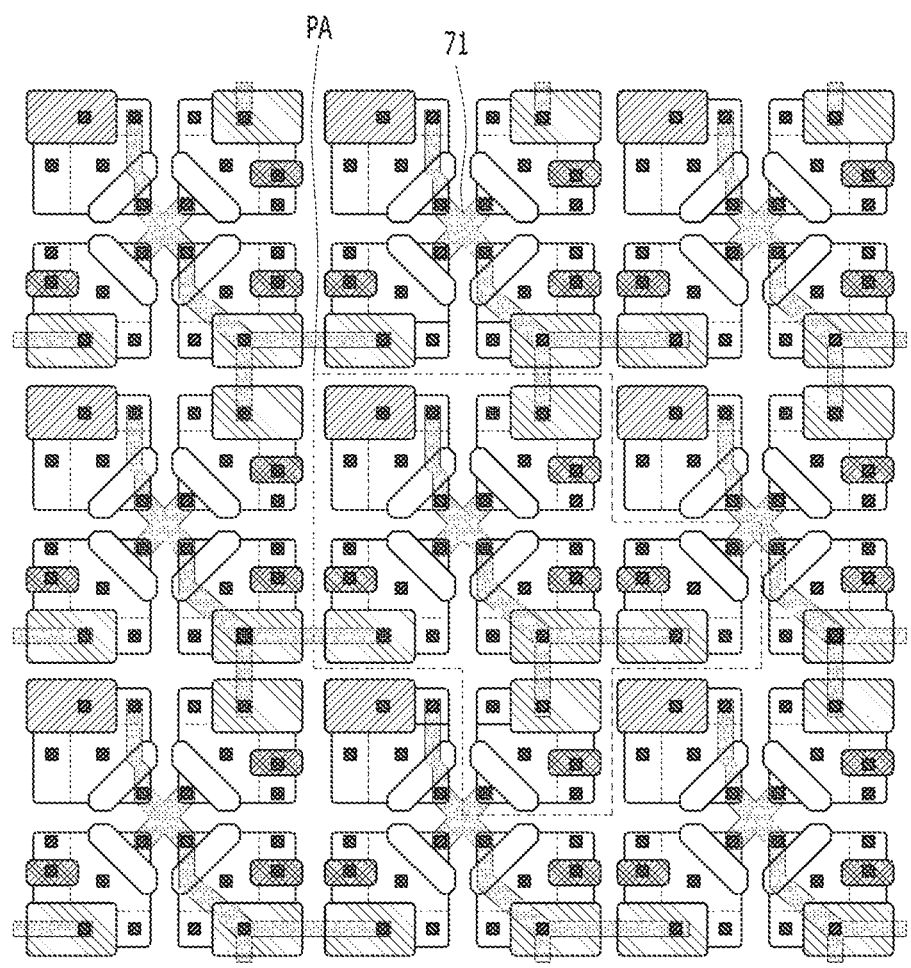
FIGS. 5A, 6A, 7A, 8A are schematic layouts illustrating electrical couplings of a pixel array of an image sensor based on some implementations of the disclosed technology.
Figure 5B:
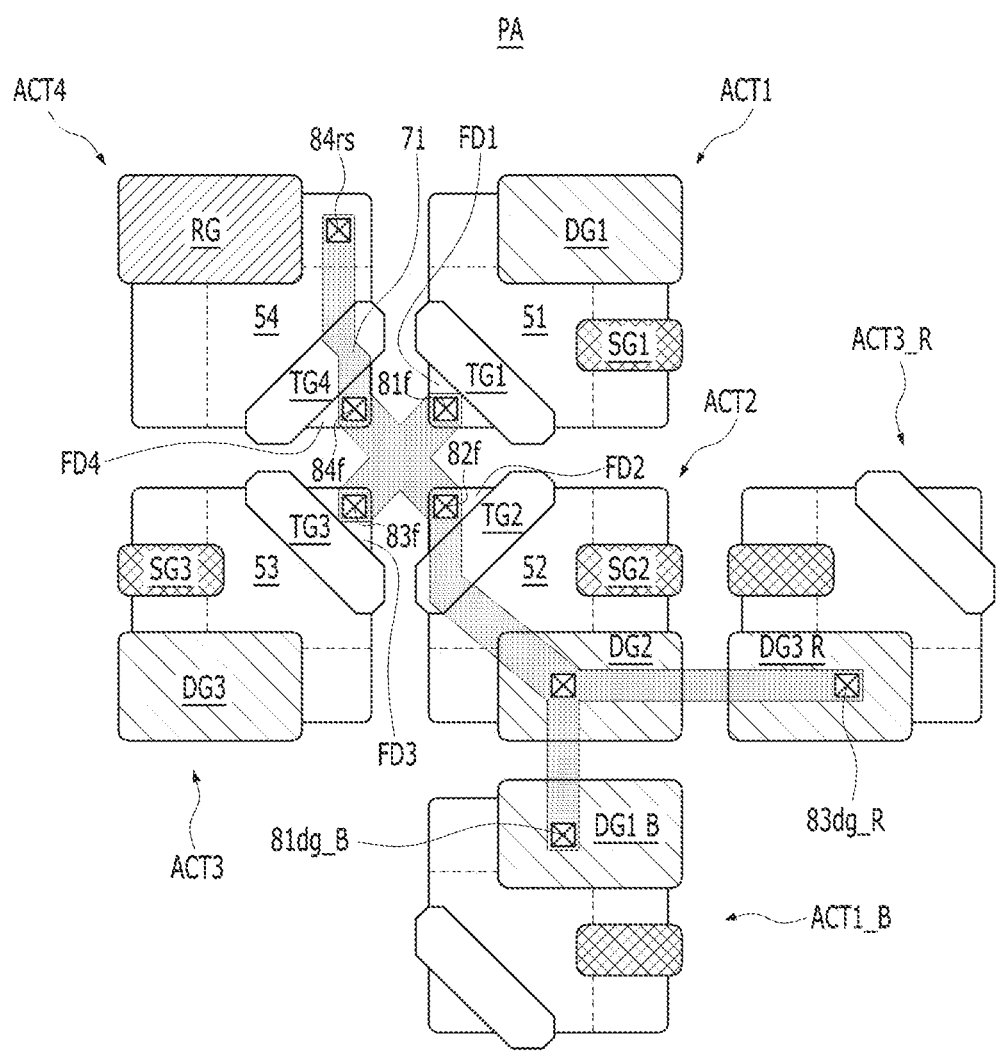
FIGS. 5B, 6B, 7B, 8B are enlarged views of unit pixel blocks of the image sensors of FIGS. 5A, 6A, 7A, 8A, respectively.

FIGS. 5A and 5B to 8A and 8B are schematic layouts illustrating electrical couplings of the pixel array of the image sensor based on some implementations of the disclosed technology, and enlarged views of the electrical unit pixel block PA, respectively. Referring to FIGS. 5A and 5B, the reset transistor source contact 84*rs* of the fourth active region ACT4, the first to fourth floating diffusion contacts 81*f* to 84*f* of the first to fourth active regions ACT1 to ACT4, the second drive transistor gate contact 82*dg* of the second active region ACT2, a first drive transistor gate contact 81*df*_B of a first active region ACT1_B of a unit pixel block PX adjacent to the second active region ACT2 in the column direction, and a third drive transistor gate contact 83*dg*_R of a third active region ACT3_R of a unit pixel block PX adjacent to the second active region ACT2 in the row direction may be electrically coupled through a first metal wiring 71. In some implementations, photocharges stored in the first to fourth floating diffusion regions FD1 to FD4 within the same unit pixel block PX may be simultaneously provided to the second drive transistor gate DG2, a first drive transistor gate DG1_B within the unit pixel block PX adjacent in the column direction, and a third drive transistor gate DG3_R within the unit pixel block PX adjacent in the row direction. Therefore, the second drive transistor gate DG2 within the second active region ACT2, the first drive transistor gate DG1_B within the unit pixel block PX adjacent to in the column direction, and the third drive transistor gate DG3_R within the unit pixel block PX adjacent in the row direction may be turned on or off at the same time. The first to fourth floating diffusion regions FD1 to FD4 within the same unit pixel block PX may be reset by the supply voltage Vdd provided from the reset transistor source region 64b within the fourth active region ACT4 of the same unit pixel block PX. Referring to FIG. 2, the second drive transistor gate DG2 within the unit pixel block PX, the first drive transistor gate DG1_B within the unit pixel block PX adjacent in the column direction, and the third drive transistor gate DG3_R within the unit pixel block PX adjacent in the row direction may correspond to the first to third drive transistors DX1 to DX3. The first metal wiring 71 is a conceptual layout. Thus, the first metal wiring 71 may be modified in various shapes. The first metal wiring 71 may electrically couple the reset transistor source contact 84rs of the fourth active region ACT4, the first to fourth floating diffusion contacts 81f to 84f of the first to fourth active regions ACT1 to ACT4, the second drive transistor gate contact 82dg of the second active region ACT2, the first drive transistor gate contact 81df_B of the first active region ACT1_B of the unit pixel block PX adjacent to the second active region ACT2 in the column direction, and the third drive transistor gate contact 83dg_R of the third active region ACT3_R of the unit pixel block PX adjacent to the second active region ACT2 in the row direction.

Figure 6A:
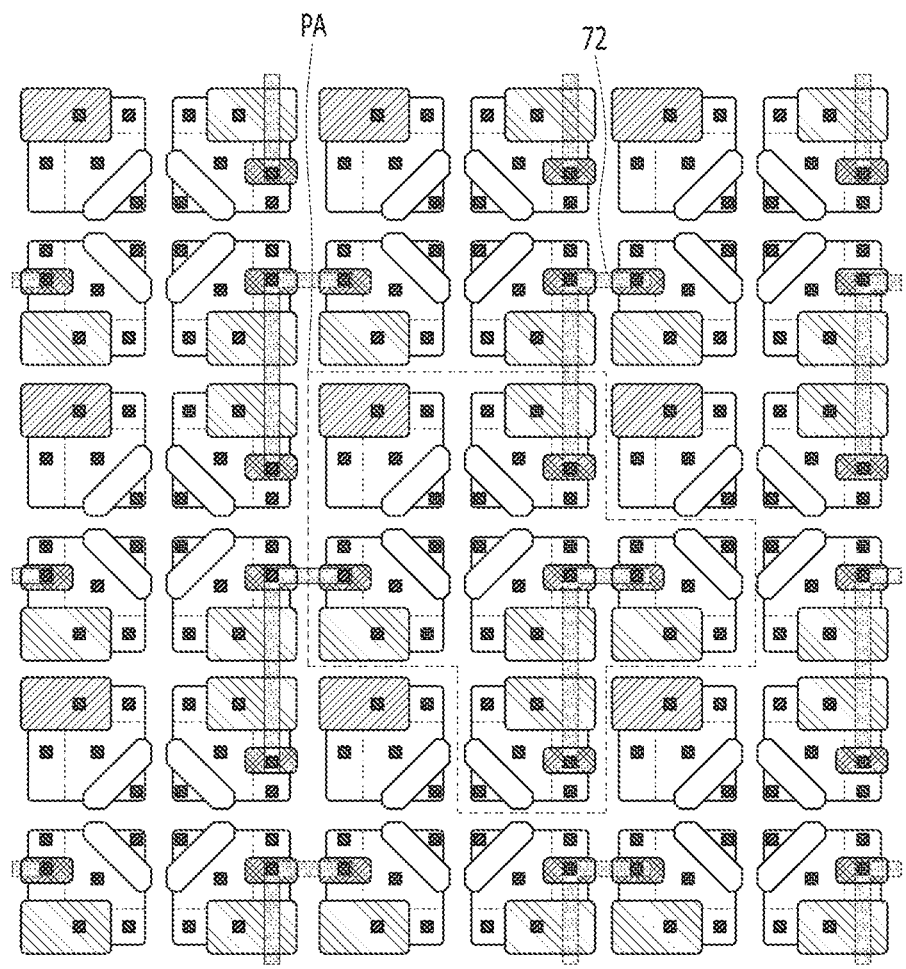
Figure 6B:
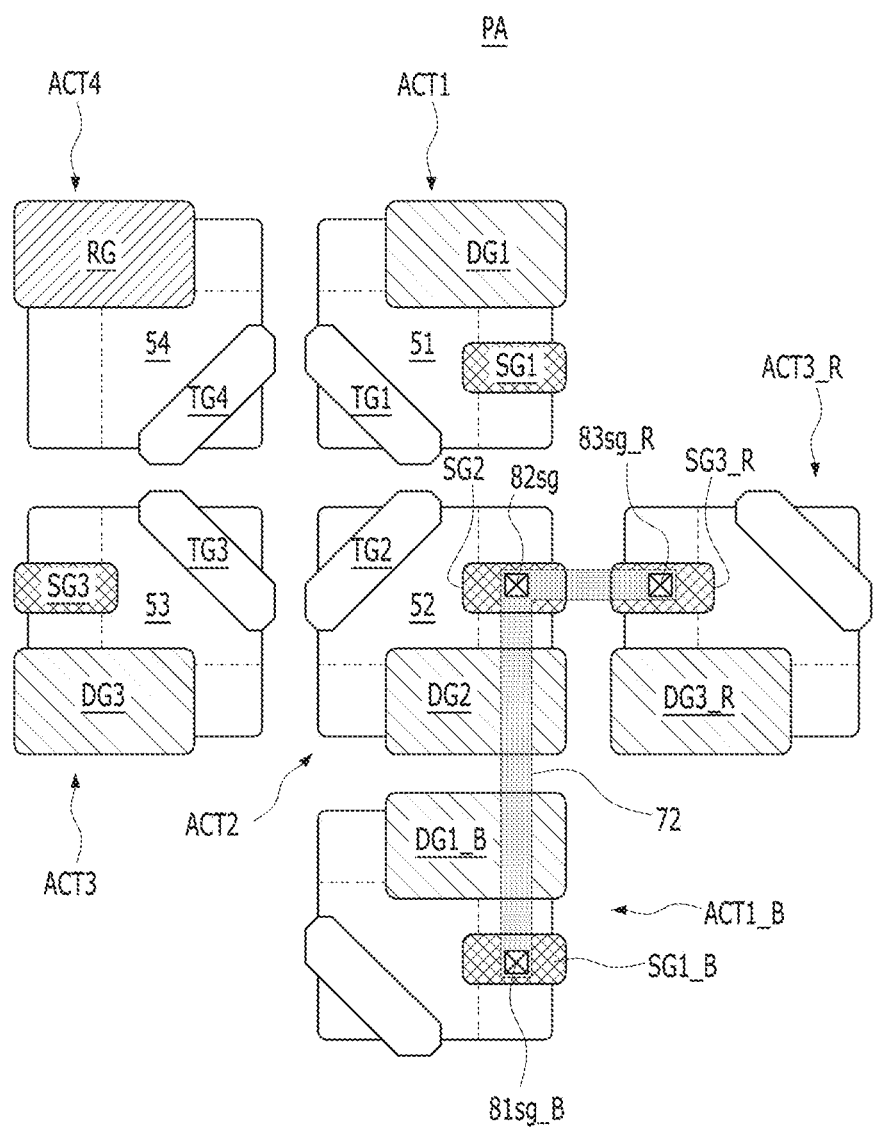

Referring to FIGS. 6A and 6B, in the electrical unit pixel block PA, the second select transistor gate contact 82sg of the second active region ACT2, a first select transistor gate contact 81sg_B within the first active region ACT1_B of the unit pixel block PX adjacent in the column direction, and a third select transistor gate contact 83sg_R within the third active region ACT3_R of the unit pixel block PX adjacent in the row direction may be electrically coupled through a second metal wiring 72. The second metal wiring 72 is a conceptual layout. Thus, the second metal wiring 72 may be modified in various shapes. The second metal wiring 72 may electrically couple the second select transistor gate contact 82sg of the second active region ACT2, the first select transistor gate contact 81sg_B within the first active region ACT1_B of the unit pixel block PX adjacent in the column direction, and the third select transistor gate contact 83sg_R within the third active region ACT3_R of the unit pixel block PX adjacent in the row direction.

Figure 7A:
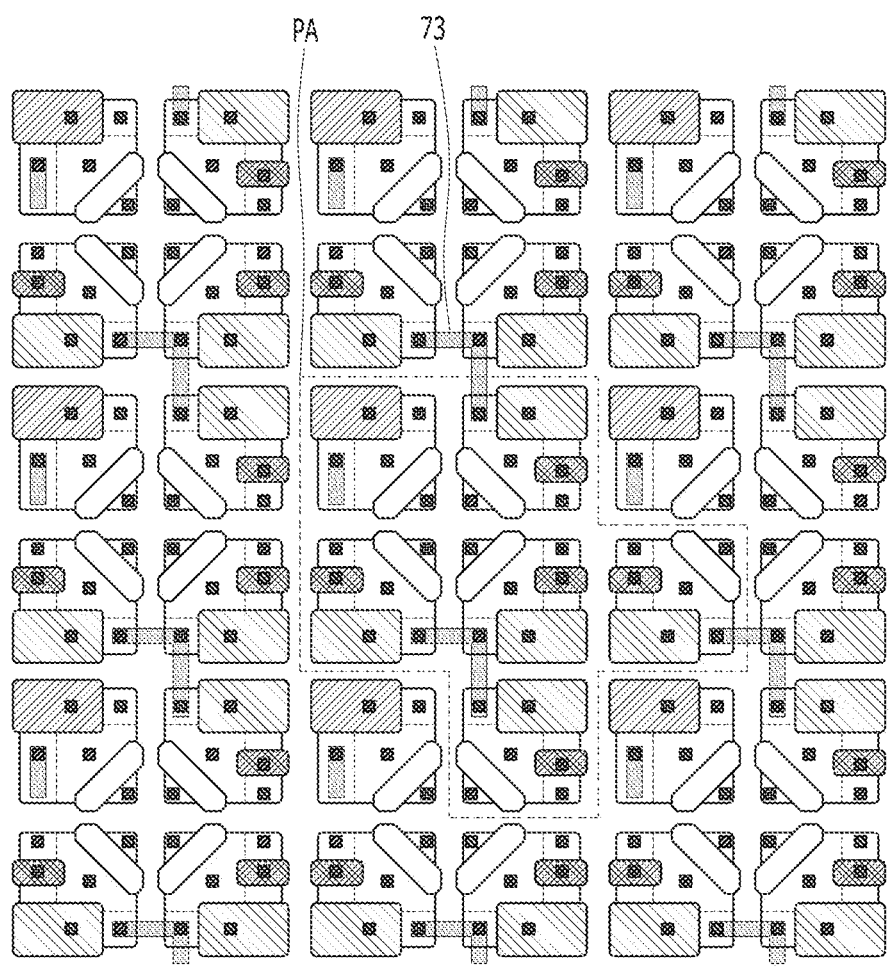
Figure 7B:
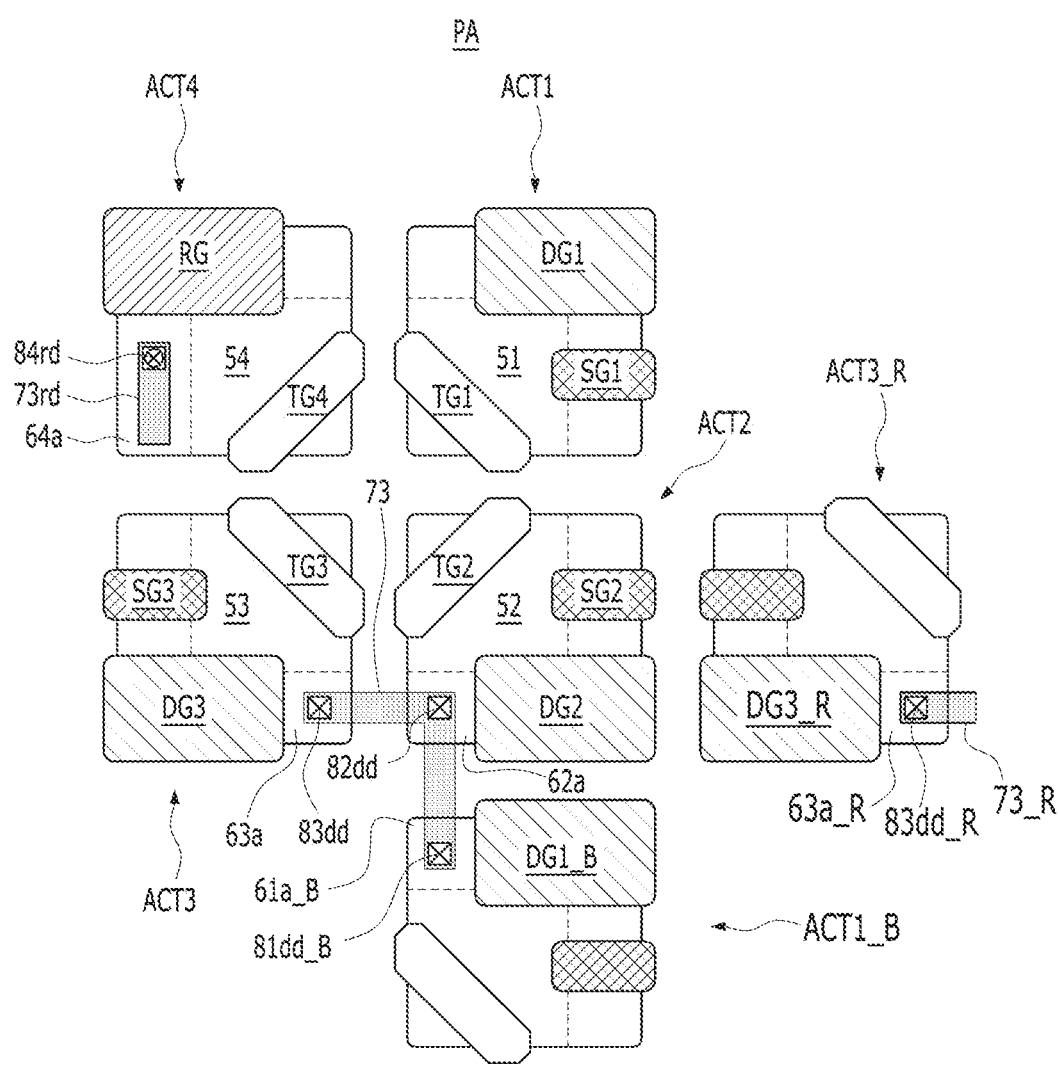

Referring to FIGS. 7A and 7B, in the electrical unit pixel block PA, the reset transistor drain contact 84rd within the fourth active region ACT4 may be electrically coupled to the supply voltage Vdd through a reset metal wiring 73rd, and the second drive transistor drain contact 82dd within the second active region ACT2, the third drive transistor drain contact 83dd within the third active region ACT3, and a first drive transistor drain contact 81dd B of the first active region ACT1_B of the unit pixel block PX adjacent in the column direction may be electrically coupled through a third metal wiring 73. The third metal wiring 73 may be coupled to the supply voltage Vdd. A third drive transistor drain contact 83dd_R within the third active region ACT3_R of the unit pixel block PX adjacent in the row direction may be coupled to the supply voltage Vdd through another third metal wiring 73_R. The reset metal wiring 73rd and the third metal wirings 73 and 73_R are conceptual layouts. Thus, the reset metal wiring 73rd and the third metal wirings 73 and 73_R may be modified in various shapes. The reset metal wiring 73rd and the third metal wirings 73 and 73_R may electrically couple the reset transistor drain contact 84rd, the second drive transistor drain contact 82dd, the third drive transistor drain contact 83dd within the third active region ACT3, and the first drive transistor drain contact 81dd_R of the first active region ACT1_B of the unit pixel block PX adjacent in the column direction.

Figure 8A:
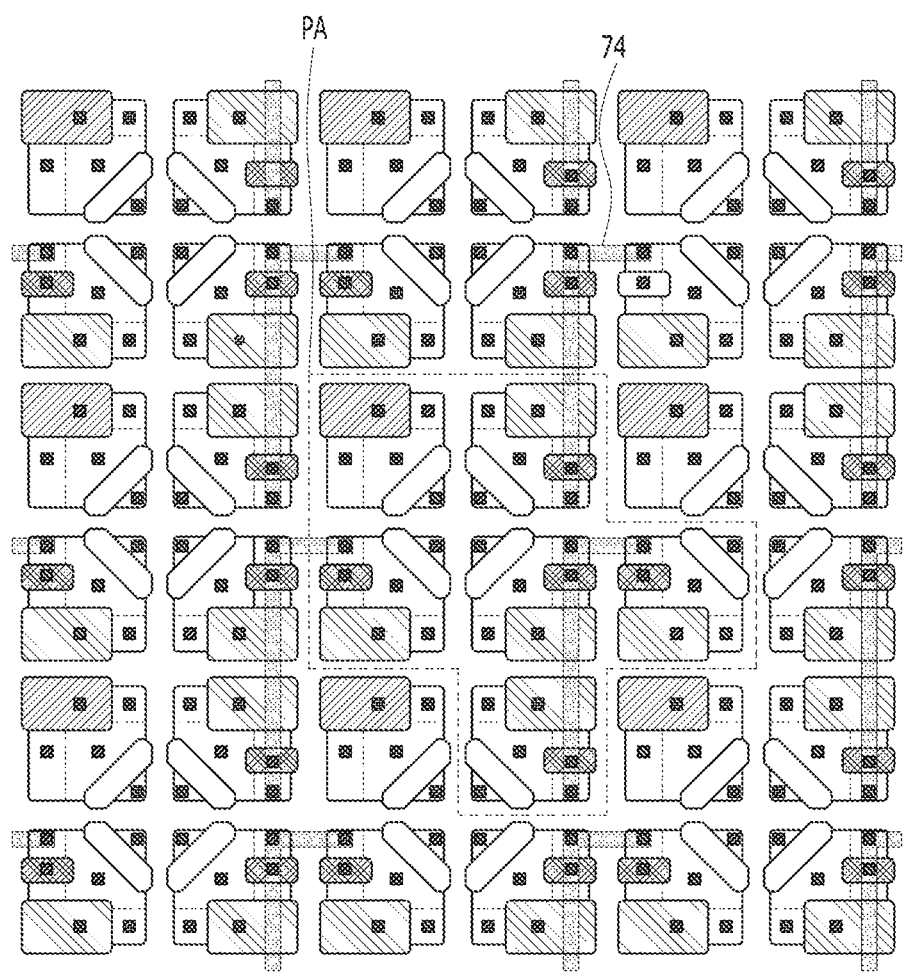
Figure 8B:
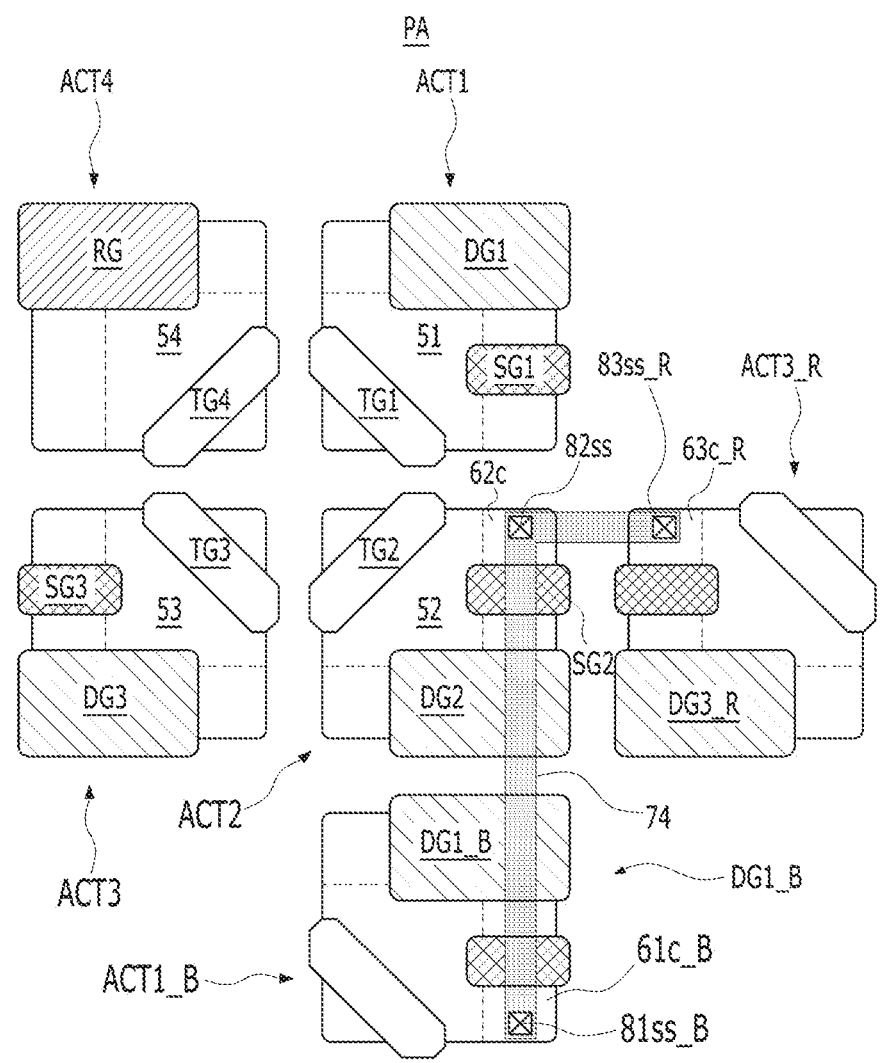

Referring to FIGS. 8A and 8B, in the electrical unit pixel block PA, the second select transistor source contact 82ss within the second active region ACT2, a first select transistor source contact 81ss B within the first active region ACT1_B of the unit pixel block PX adjacent in the column direction, and a third select transistor source contact 83ss_R within the third active region ACT3_R of the unit pixel block PX adjacent in the row direction may be electrically coupled through a fourth metal wiring 74. The fourth metal wiring 74 may be coupled to the output node (Vout of FIG. 2). The fourth metal wiring 74 is a conceptual layout. Thus, the fourth metal wiring 74 may be modified in various shapes. The fourth metal wiring 74 may electrically couple the second select transistor source contact 82ss, the first select transistor source contact 81ss_B within the first active region ACT1_B of the unit pixel block PX adjacent in the column direction, and the third select transistor source contact 83ss_R within the third active region ACT3_R of the unit pixel block PX adjacent in the row direction.

Referring to FIGS. 5A and 5B to 8A and 8B, image information in one electrical unit pixel block PA may be provided to the image processor through some of the components within the same unit pixel block PX and some of components within other adjacent unit pixel blocks PX. For example, image information in one unit pixel block PX may be included in a circuit for transferring one piece of pixel image information through the first to fourth transfer transistor gates TG1 to TG4, the first to fourth floating diffusion regions FD1 to FD4, the reset transistor components RG, 64A and 64B, and the second drive transistor and select transistor components DG2, SG2, 62a, 62b, and 62c within the same unit pixel block PX, the first drive transistor and select transistor components DG1_B, SG1_B, 61a_B to 62c_B of the first active region ACT1_B of the unit pixel block PB adjacent in the column direction, and the third drive transistor and select transistor components DG3_R, SG3_R and 63a_R to 62c_R of the third active region ACT3_B of the unit pixel block PX adjacent in the row direction. The first drive transistor and select transistor components DG1, SG1, and 61a to 63a within the first active region ACT1 and the third drive transistor, and select transistor components DG3, SG3, and 63A to 63C within the third active region ACT3 may be included in a circuit for transferring image information of other adjacent unit pixel blocks PX.

Figure 9A:
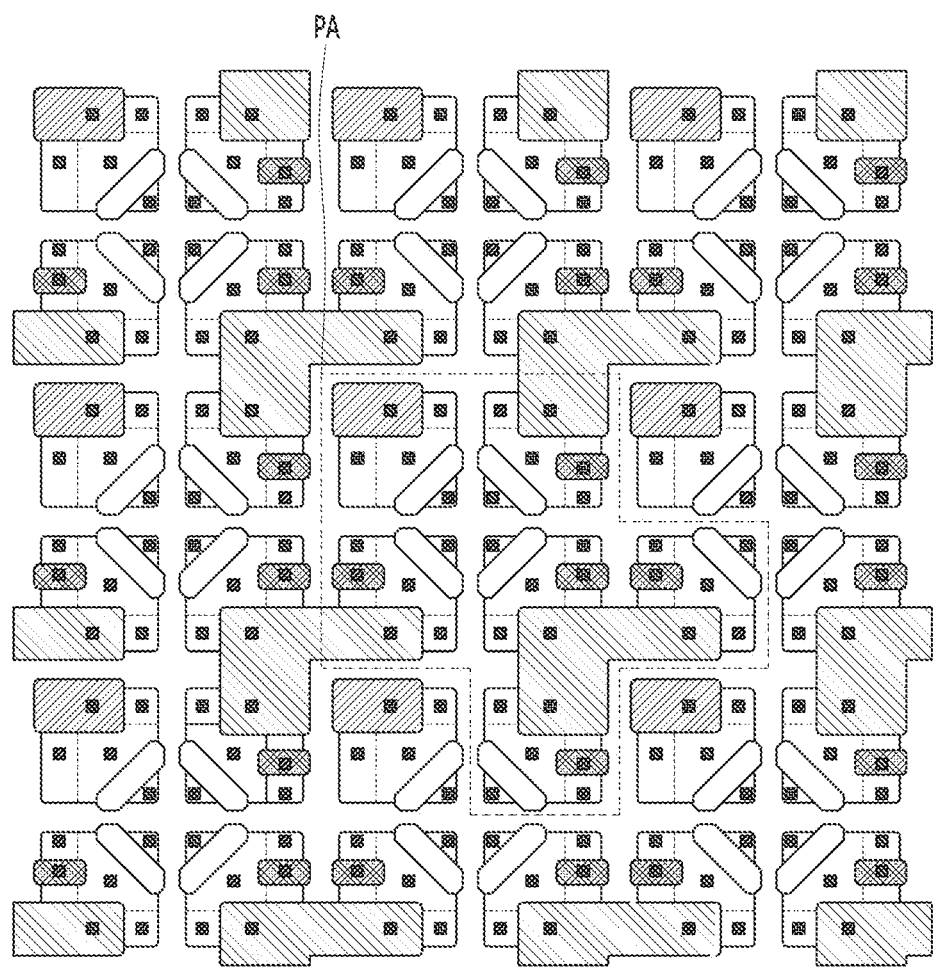
FIG. 9A is an example of a schematic layout illustrating electrical couplings of a pixel array of an image sensor based on one implementation of the disclosed technology.
Figure 9B:
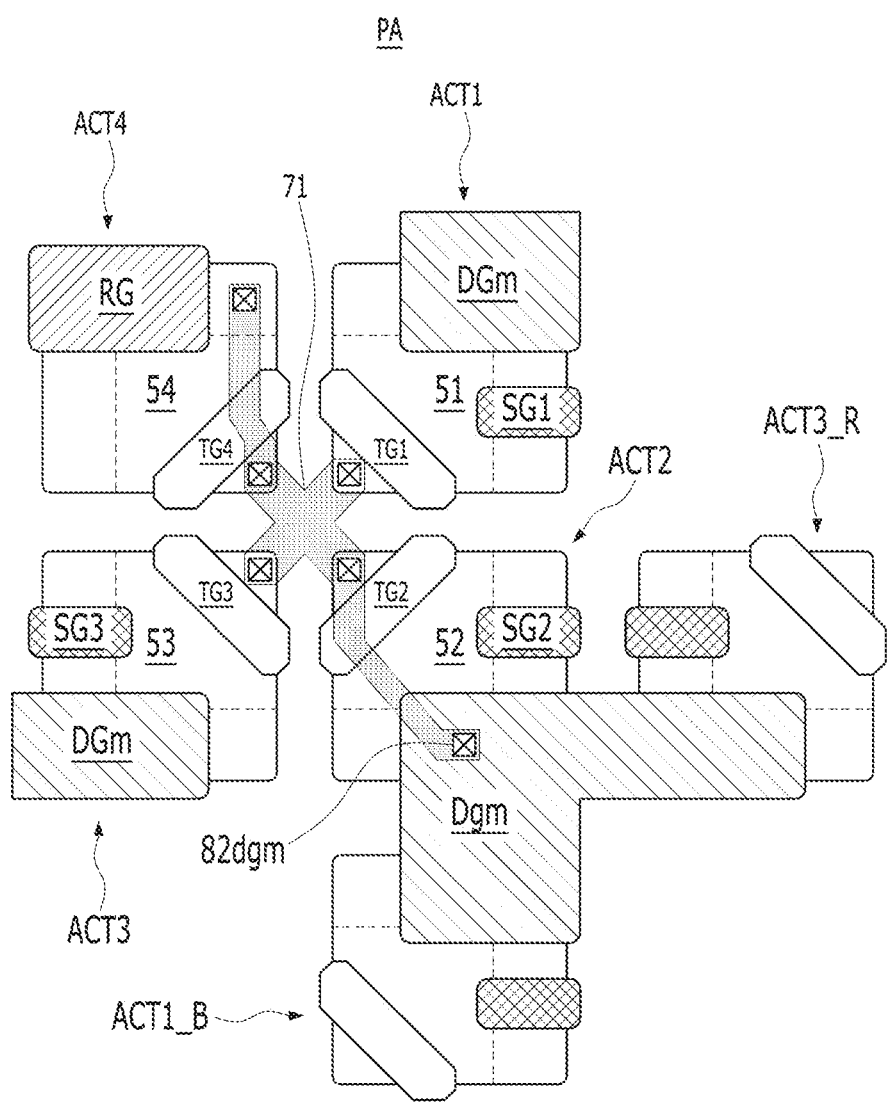
FIG. 9B is an enlarged view of a unit pixel block of the image sensor of FIG. 9A.

FIGS. 9A and 9B are a schematic layout illustrating electrical couplings of a pixel array of an image sensor based on one implementation of the disclosed technology, and an enlarged view of an electrical unit pixel block PA. Referring to FIGS. 9A and 9B, the unit pixel block PX may include a merged drive transistor gate DGm, compared to the unit pixel block PX illustrated in FIGS. 3A to 8B. Specifically, the second drive transistor gate DG2 within the second active region ACT2 of the same unit pixel block PX, the first drive transistor gate DG1_B within the third active region ACT3 of the unit pixel block PX adjacent in the column direction, and the third drive transistor gate DG3_R within the unit pixel block PX adjacent in the row direction may be merged into one transistor gate. Therefore, the merged drive transistor gate DGm may be coupled to the first metal wiring 71 through a merged single drive transistor gate contact 82dgm.

Figure 10A:
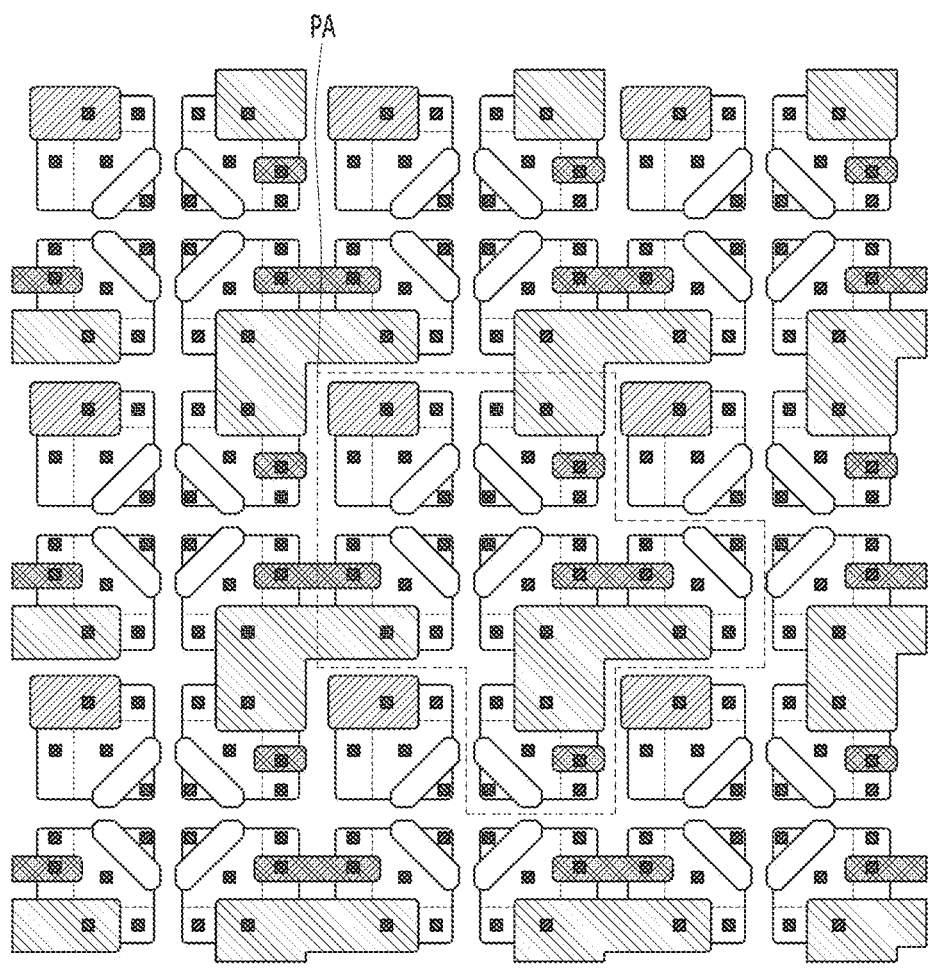
FIG. 10A is an example of a schematic layout illustrating electrical couplings of a pixel array of an image sensor based on some implementations of the disclosed technology.
Figure 10B:
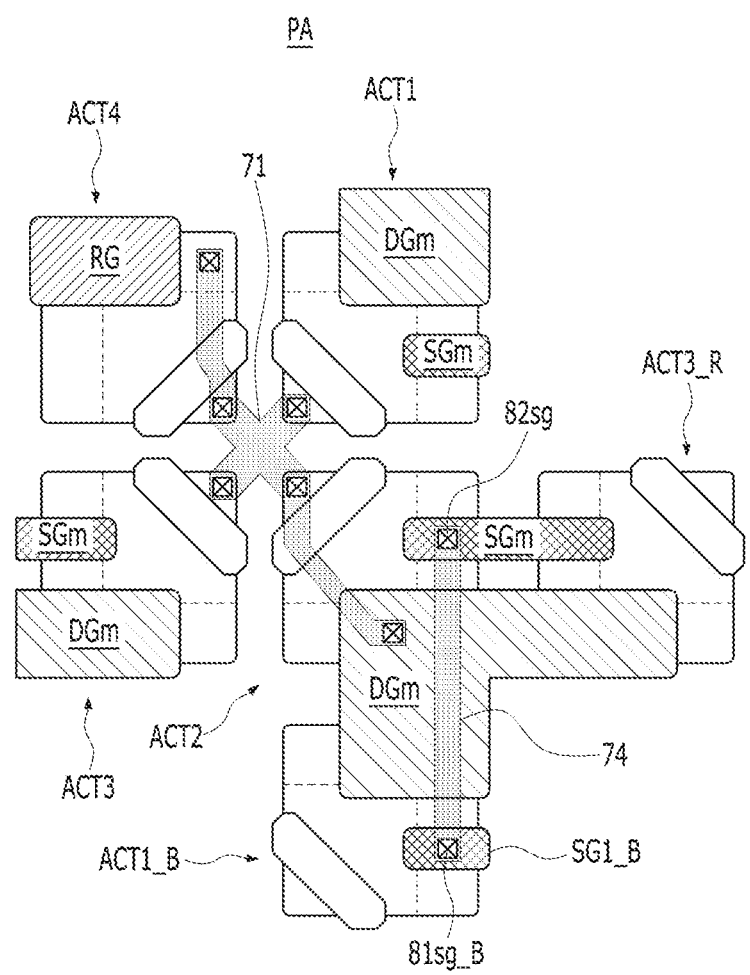
FIG. 10B is an enlarged view of a unit pixel block of the image sensor of FIG. 10A.

FIGS. 10A and 10B are a schematic layout illustrating electrical couplings of a pixel array of an image sensor based on one implementation of the disclosed technology, and an enlarged view of an electrical unit pixel block PA. Referring to FIGS. 10A and 10B, the pixel array may include a merged select transistor gate SGm, compared to the pixel array illustrated in FIGS. 9A and 9B. In some implementations, the second select transistor gate SG2 within the second active region ACT2 of the unit pixel block PX and the third select transistor gate SG3 of the unit pixel block PX adjacent in the row direction may be merged into one select transistor gate. Therefore, the merged select transistor gate SGm may be coupled to the fourth metal wiring 74 through a merged single select transistor gate contact 82sgm. The first select transistor gate SG1_B of the first active region ACT1_B of the unit pixel block PX adjacent in the column direction may not be merged.

Figure 11A:
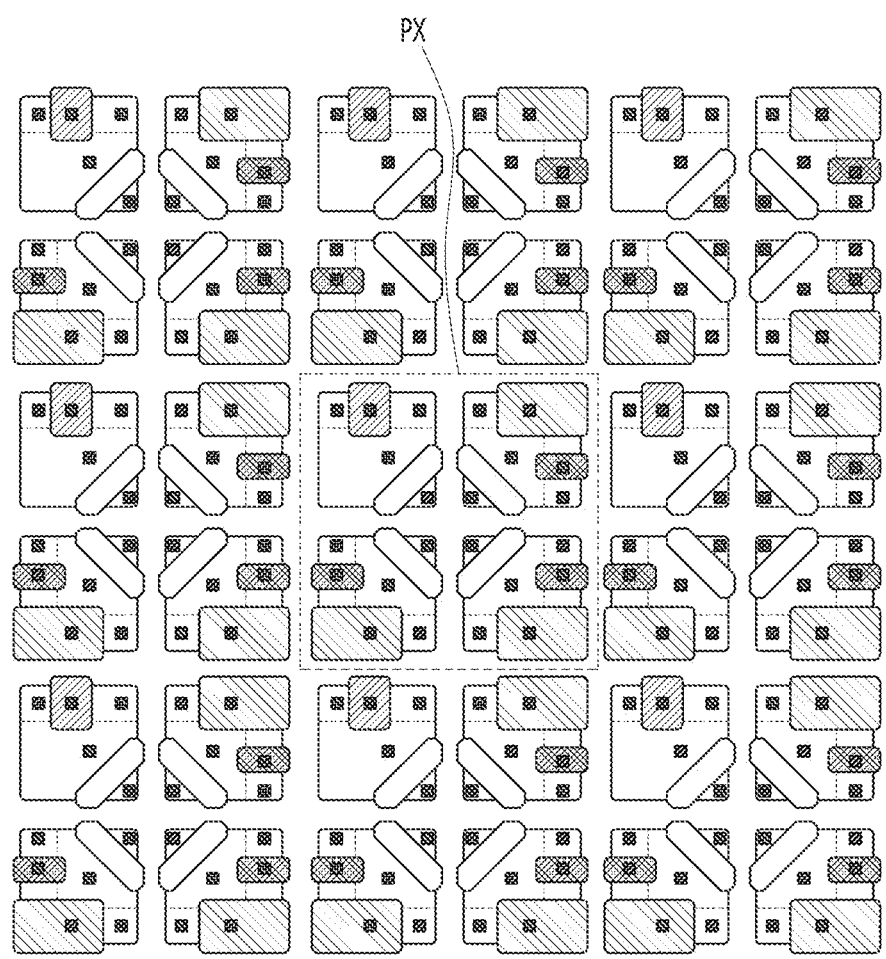
FIG. 11A is an example of a layout illustrating an arrangement of unit pixel blocks in a pixel array of an image sensor based on some implementations of the disclosed technology.

FIGS. 11A and 11B are a layout and enlarged view illustrating an arrangement of unit pixel blocks PX of a pixel array of an image sensor based on one implementation of the disclosed technology. Referring to FIGS. 11A and 11B, the unit pixel block PX may include a reset transistor gate RG (or reset transistor channel region RC) disposed to abut one side of the fourth active region ACT4 and a reset transistor drain region 64a and reset transistor drain contact 84rd disposed on one corner of the fourth active region ACT4, compared to the unit pixel block PX of FIGS. 3A to 3C. Compared to FIG. 3C, the unit pixel block PX may include the reset transistor source region 64b disposed on the first corner of the fourth active region ACT4, the fourth floating diffusion region FD4 disposed on the second corner, the fourth well-tap region 54 enlarged from the center to the third corner, and the reset transistor drain region 64a disposed on the fourth corner. As an example, the first corner may be set to the right top corner, the second corner may be set to the right bottom corner, the third corner may be set to the left bottom corner, and the fourth corner may be set to the left top corner.

Figure 11C:
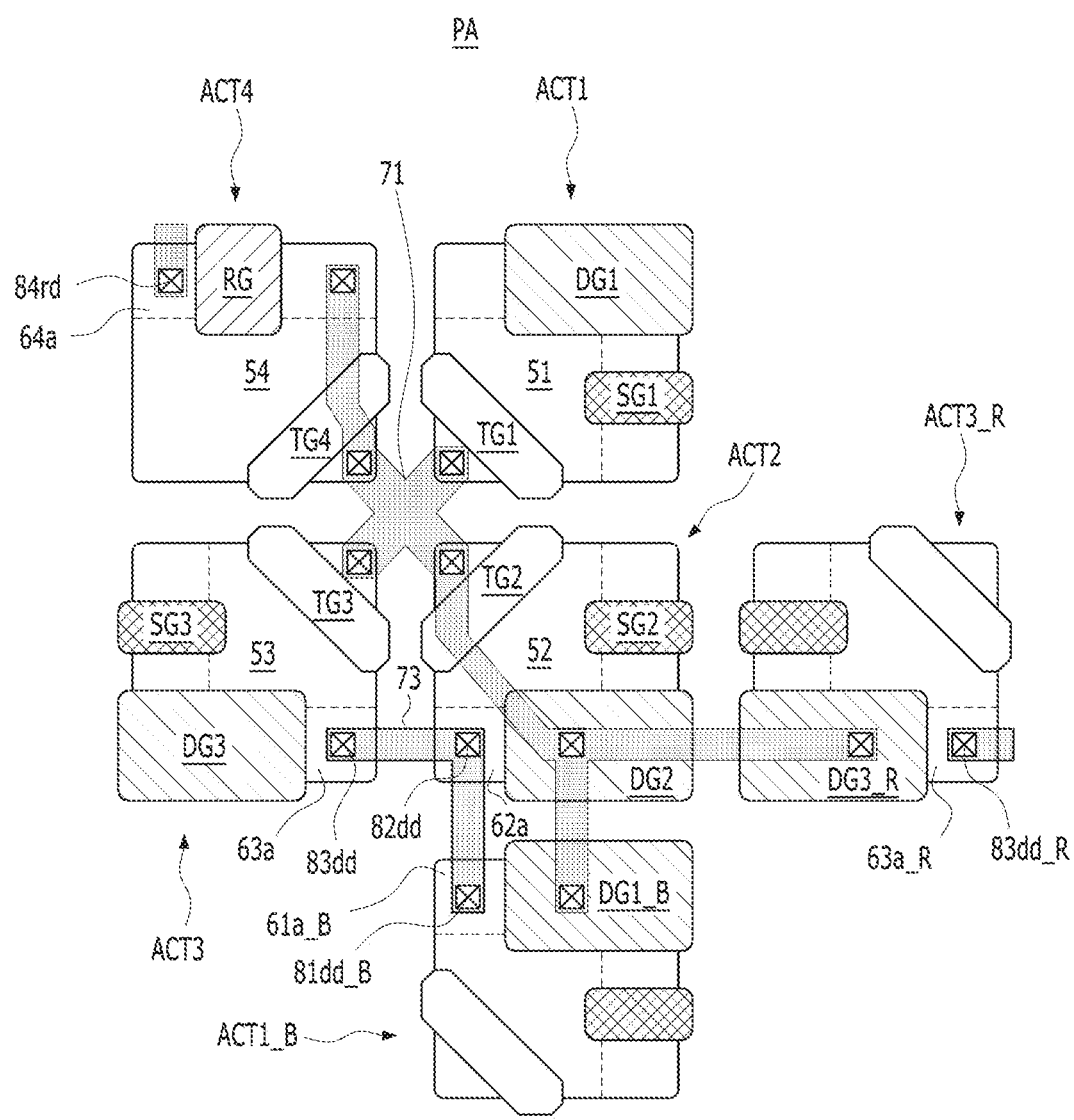
FIG. 11C is an enlarged layout illustrating electrical couplings of unit pixel blocks of the pixel array illustrated in FIGS. 11A and 11B.

FIG. 11C is an enlarged layout illustrating electrical couplings of the electrical unit pixel blocks PA of the pixel array illustrated in FIGS. 11A and 11B. Referring to FIG. 11C, the reset metal wiring 73rd illustrated in FIG. 7B may be disposed adjacent to one corner of the fourth active region ACT4. Components which are not described herein will be able to be understood with reference to FIGS. 5A and 5B to 8A and 8B.

Figure 12:
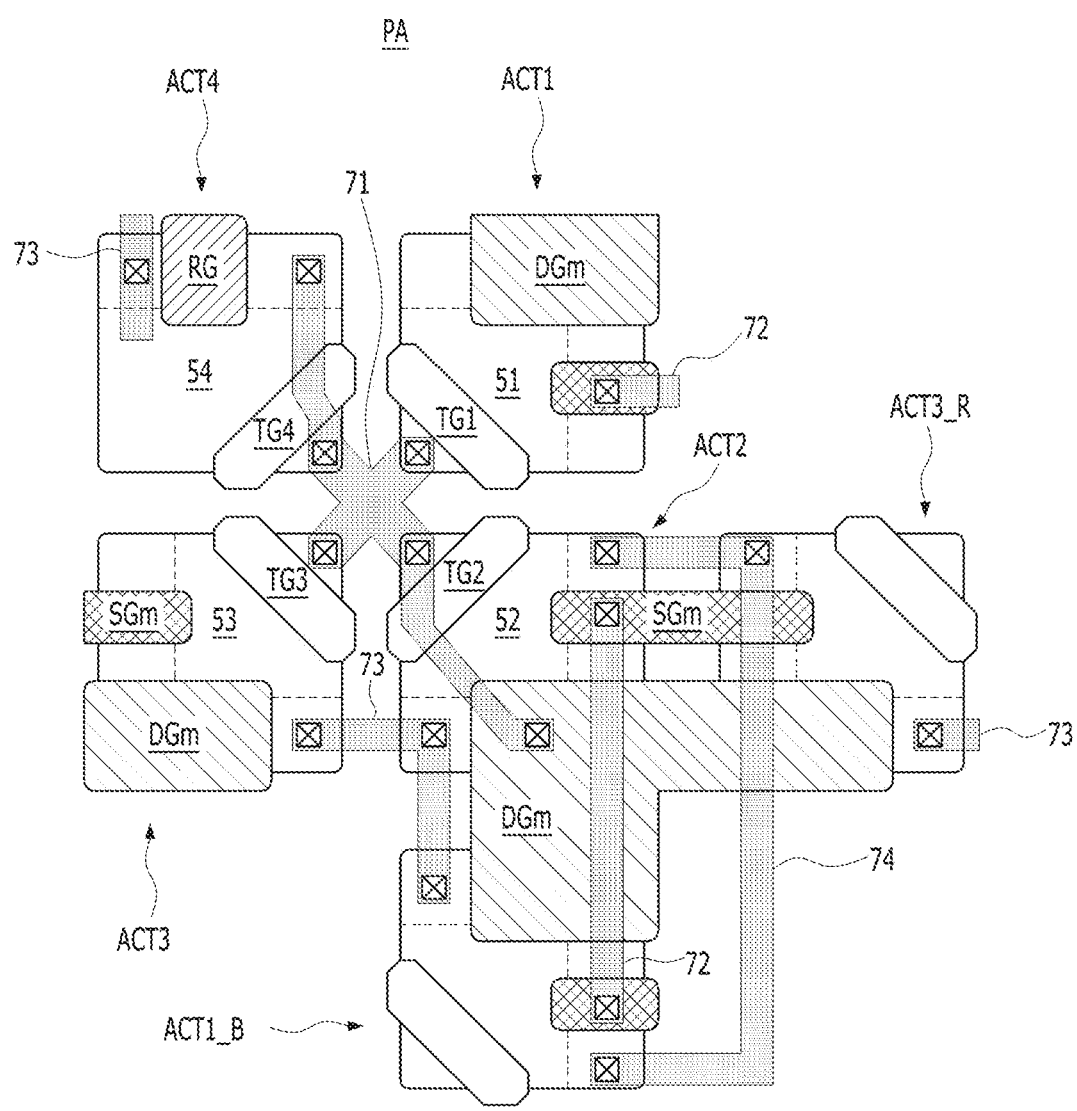
FIG. 12 is an enlarged layout illustrating electrical couplings of an electrical unit pixel block of a pixel array of an image sensor based on one implementation of the disclosed technology.

FIG. 12 is an enlarged layout illustrating electrical couplings of the electrical unit pixel blocks PA of the pixel array of the image sensor based on some implementations of the disclosed technology. For example, FIG. 12 illustrates the electrical couplings of the electrical unit pixel block PA illustrated in FIGS. 9A and 9B and 10A and 10B. In order to remove the complexity of the drawing, some of reference numerals may be omitted. Therefore, the omitted reference numerals will be able to be understood with reference to other drawings. Referring to FIG. 12, the first metal wiring 71 may couple the reset transistor source region 64b, the first to fourth floating diffusion regions FD1 to FD4 and the merged drive transistor gate DGm. The second metal wiring 72 may electrically couple the merged select transistor gate SGm and the first select transistor gate SG1_B of the first active region ACT1_B of the pixel block PX adjacent in the column direction. The third metal wiring 73 may electrically couple the second drive transistor drain region 62a, the third drive transistor drain region 63a, and the first drive transistor drain region 61a of the first active region ACT1_B of the unit pixel block PX adjacent in the column direction. The fourth metal wiring 74 may electrically couple the second select transistor source region 62c, the third select transistor source region 63c_R of the third active region ACT3_R of the unit pixel block PX adjacent in the row direction, and the first select transistor source region 61c_B of the first active region ACT1_B of the unit pixel block PX adjacent in the column direction. The shapes of the first to fourth metal wirings 71 to 74 are only examples for conceptually describing the electrical couplings. Within the technical descriptions of the present embodiment, the first to fourth metal wirings 71 to 74 may be modified in various shapes.

Figure 13:
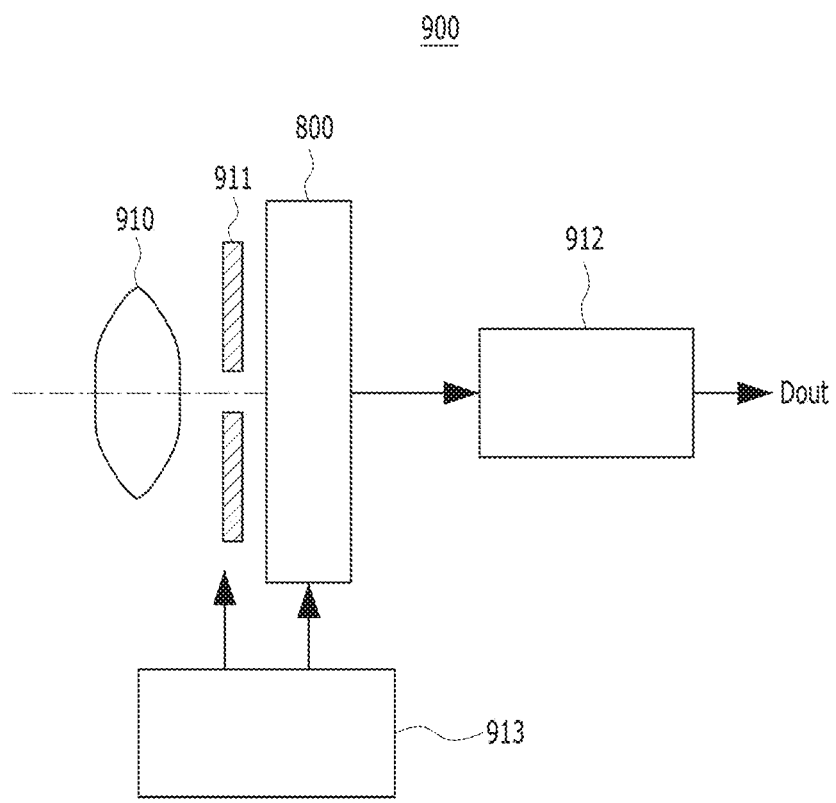
FIG. 13 is a diagram schematically illustrating an electronic device having an image sensor based on one implementation of the disclosed technology.

FIG. 13 is a block diagram schematically illustrating a camera system 900 having an image sensor 800 in accordance with an embodiment. Referring to FIG. 13, the camera system 900 having various image sensors 800 in accordance with the present embodiments may take a still image or moving image. The camera system 900 may include an optical lens system 910, a shutter unit 911, a driver 913 for controlling/driving the image sensor 800 and the shutter unit 911, and a signal processor 912. The camera system 900 may guide image light (incident light) Li from an object to the pixel array (refer to 810 of FIG. 1) of the image sensor 800. The optical lens system 910 may include a plurality of optical lenses. The shutter unit 911 may control a light irradiation period and shielding period for the image sensor 800. The driver 913 may control a transfer operation of the image sensor 800 and a shutter operation of the shutter unit 911. The signal processor 912 may perform various types of signal processing operations on a signal outputted from the image sensor 800. The processed image signal Dout may be stored in a storage medium such as a memory or outputted on a monitor or the like.

Although various embodiments have been described for illustrative purposes, it will be apparent to those skilled in the art that various changes and modifications may be made.

What is claimed is:

1. An image sensor comprising an active region, wherein the active region comprises:
    a floating diffusion region positioned around a first corner of the active region and operable to store photocharges generated in response to an incident light to the image sensor;
    a transfer transistor gate region positioned adjacent to the floating diffusion region and operable to transfer the photocharges to the floating diffusion region;
    transistor active regions positioned adjacent to the transfer transistor gate region; and
    a well-tap region positioned between the transfer transistor gate region and the transistor active regions to separate the transfer transistor gate region from the transistor active regions,
    wherein the well-tap region is extended to contact two neighboring sides of the active region, and
    wherein the transistor active regions comprise a drive transistor drain region disposed adjacent to a second corner of the active region, a drive transistor channel region disposed adjacent to a third corner of the active region, and a select transistor source region disposed adjacent to a fourth corner of the active region.

2. The image sensor of claim 1, wherein the well-tap region is positioned at a center of the active region.

3. The image sensor of claim 1, wherein the transfer transistor gate region has a bar shape across the active region.

4. The image sensor of claim 1, wherein the transfer transistor gate region has a bar shape extending along a diagonal direction between the floating diffusion region and the well-tap region.

5. The image sensor of claim 1, wherein the transfer transistor gate region contacts two neighboring sides of the active region.

6. The image sensor of claim 1, wherein the transistor active region comprises a drive transistor drain region and a select transistor source region that include an N-doped region, and the transistor active region further comprises a drive transistor channel region including a P-doped region.

7. The image sensor of claim 1, wherein the transistor active regions comprise a drive transistor channel region and a select transistor source region and further comprise a shared transistor region and a select transistor channel region that are disposed between the drive transistor channel region and the select transistor source region.

8. The image sensor of claim 7, wherein the shared transistor region includes an N-doped region, and the select transistor channel region includes a P-doped region.

9. The image sensor of claim 1, wherein the active region has a rectangular shape.

10. An image sensor comprising an active region, wherein the active region comprises:
a floating diffusion region positioned around a first corner of the active region and operable to store photocharges generated in response to an incident light to the image sensor;
a transfer transistor gate region positioned adjacent to the floating diffusion region and operable to transfer the photocharges to the floating diffusion region;
transistor active regions positioned adjacent to the transfer transistor gate region; and
a well-tap region positioned between the transfer transistor gate region and the transistor active regions to separate the transfer transistor gate region from the transistor active regions,
wherein the well-tap region is extended to contact two neighboring sides of the active region, and
wherein the transistor active regions comprise a reset transistor drain region disposed adjacent to a second corner of the active region, a reset transistor source region disposed adjacent to a third corner of the active region, and a reset transistor channel region disposed between the reset transistor drain region and the reset transistor source region.

11. The image sensor of claim 10, wherein the reset transistor channel region is disposed adjacent to a fourth corner of the active region, and abuts two neighboring sides of the active region, and
wherein the second and third corners are opposite to each other.

12. An image sensor comprising first to fourth active regions defined by a trench isolation region and arranged in a matrix shape,
wherein the first to fourth active regions respectively comprise:
first to fourth floating diffusion regions;
first to fourth well-tap regions; and
first to fourth transistor active regions,
wherein the first to fourth floating diffusion regions are disposed adjacent to first corners of the first to fourth active regions, respectively,
the first to fourth well-tap regions are disposed around centers of the first to fourth active regions, respectively,
the first to fourth transistor active regions are disposed adjacent to second to fourth corners of the first to fourth active regions, respectively, and
the first to fourth well-tap regions abut two neighboring sides of the first to fourth active regions to isolate the first to fourth floating diffusion regions from the first to fourth transistor active regions, respectively.

13. The image sensor of claim 12, wherein the first to fourth active regions further comprise first to fourth transfer transistor gate regions, respectively, each of the first to fourth transfer transistor gate being disposed between a corresponding one of the first to fourth floating diffusion regions and a corresponding one of the first to fourth well-tap regions.

14. The image sensor of claim 13, wherein the first to fourth transfer transistor gate regions abut the two neighboring sides of the first to fourth active regions, respectively.

15. The image sensor of claim 12, wherein the first to fourth well-tap regions include P-doped regions, and the first to fourth transistor active regions include N-doped regions.

* * * * *